(12) United States Patent
Lee

(10) Patent No.: US 7,718,508 B2
(45) Date of Patent: May 18, 2010

(54) SEMICONDUCTOR BONDING AND LAYER TRANSFER METHOD

(76) Inventor: Sang-Yun Lee, 17082 NW. Elk Run Dr., Beaverton, OR (US) 97006

(*) Notice: Subject to any disclaimer, the term of this patent is extended or adjusted under 35 U.S.C. 154(b) by 293 days.

(21) Appl. No.: 11/873,851

(22) Filed: Oct. 17, 2007

(65) Prior Publication Data
US 2008/0038902 A1 Feb. 14, 2008

Related U.S. Application Data

(60) Division of application No. 11/092,501, filed on Mar. 29, 2005, and a continuation-in-part of application No. 10/873,969, filed on Jun. 21, 2004, now Pat. No. 7,052,941.

(51) Int. Cl.
H01L 21/30 (2006.01)
H01L 21/46 (2006.01)
H01L 29/04 (2006.01)
H01L 29/15 (2006.01)
H01L 31/036 (2006.01)
H01L 27/108 (2006.01)
H01L 29/94 (2006.01)
H01L 23/02 (2006.01)

(52) U.S. Cl. .................. 438/455; 257/74; 257/302; 257/686

(58) Field of Classification Search .................. 438/455, 438/458
See application file for complete search history.

(56) References Cited

U.S. PATENT DOCUMENTS

| | | | |
|---|---|---|---|
| 4,704,785 A | 11/1987 | Curran | |
| 4,829,018 A | 5/1989 | Wahlstrom | |
| 4,939,568 A | 7/1990 | Kato et al. | |
| 5,087,585 A | 2/1992 | Hayashi | |
| 5,093,704 A | 3/1992 | Saito et al. | |
| 5,106,775 A | 4/1992 | Kaga et al. | |
| 5,308,782 A | 5/1994 | Mazure et al. | |
| 5,355,022 A | 10/1994 | Sugahara et al. | |
| 5,554,870 A | 9/1996 | Fitch et al. | |
| 5,915,167 A | 6/1999 | Leedy | |
| 5,998,808 A | 12/1999 | Matsushita | |
| 6,153,495 A | 11/2000 | Kub et al. | |
| 6,229,161 B1 | 5/2001 | Nemati et al. | |
| 6,600,173 B2 | 7/2003 | Tiwari | |
| 6,630,713 B2 | 10/2003 | Geusic | |
| 6,995,430 B2 | 2/2006 | Langdo et al. | |
| 7,078,739 B1 | 7/2006 | Nemati et al. | |
| 2002/0024140 A1 | 2/2002 | Nakajima et al. | |
| 2002/0025604 A1 | 2/2002 | Tiwari | |
| 2003/0119279 A1* | 6/2003 | Enquist | ............ 438/455 |
| 2004/0013207 A1 | 1/2004 | Sartori et al. | |

* cited by examiner

Primary Examiner—Ha Tran T Nguyen
Assistant Examiner—Valerie Brown
(74) Attorney, Agent, or Firm—Schmeiser, Olsen & Watts LLP

(57) ABSTRACT

The present invention provides a method of coupling substrates together. The method includes providing first and second substrates and then coupling the first and second substrates together. One of the first and second substrates includes devices with an interconnect region positioned thereon and the other substrate carries a device structure.

18 Claims, 27 Drawing Sheets

SEMICONDUCTOR BONDING AND LAYER TRANSFER METHOD

CROSS REFERENCE TO RELATED APPLICATIONS

This is a divisional of application Ser. No. 11/092,501, entitled "SEMICONDUCTOR BONDING AND LAYER TRANSFER METHOD", filed on Mar. 29, 2005, which claims priority to U.S. Pat. No. 7,052,941 filed on Jun. 21, 2004, the contents of both of which are incorporated herein by reference.

BACKGROUND OF THE INVENTION

1. Field of the Invention

The present invention relates generally to semiconductors and, more particularly, to forming circuitry using wafer bonding.

2. Description of the Related Art

Advances in semiconductor manufacturing technology have provided computer chips with integrated circuits that include many millions of active and passive electronic devices, along with the interconnects to provide the desired circuit connections. As is well-known, most integrated circuits include laterally oriented active and passive electronic devices that are carried on a single major surface of a substrate. Active devices typically include transistors and passive devices typically include resistors, capacitors, and inductors. However, these laterally oriented devices consume significant amounts of chip area.

For example, a typical computer system includes a main computer chip with a processor circuit, a control circuit, and a memory cache that are carried on a single major surface of a substrate. The typical computer system also includes main memory which is positioned on a separate memory chip outside the main computer chip. Since the memory cache is positioned on the same substrate as the processor and control circuits in the main computer chip, it is often referred to as embedded memory.

The memory cache typically includes fast and expensive memory cells, such as Static Random Access Memory (SRAM) cells, and the main memory typically includes slower and less expensive Dynamic Random Access Memory (DRAM) cells. Both SRAM and DRAM cells are larger than the devices included in the processor and control circuits, with SRAM cells being much larger than DRAM cells. As is well-known in the art, cache memory (L1 cache or L2 cache, for example) is used to store information from a slower storage medium or subsystem, such as the main memory or peripherals like hard disks and CD-ROMs, that is accessed frequently to speed up the operation of the main computer chip.

The operation of the main computer chip is increased because its idle time is reduced. For example, when the processor circuit accesses the main memory, it does so in about 60 nanoseconds (ns) because the main memory is external to the main computer chip and it includes slower memory cells. However, a typical processor circuit can have cycle times of about 2 nanoseconds. As a result, the processor circuit is idle for many cycle times while it accesses the main memory. In this example, there are about 30 wasted cycles while the processor circuit accesses the main memory. The processor circuit, however, can access the cache memory in about 10 ns to 30 ns, so the idle time is significantly reduced if the information needed is temporarily stored in the cache memory. The access time of the processor circuit to a hard disk is even slower at about 10 milliseconds (ms) to 12 ms, and the access time to a CD-ROM drive is about 10 times greater than this. Hence, cache memory uses a small amount of fast and expensive memory to allow the processor circuit faster access to information normally stored by a large amount of slower, less-expensive memory.

With this in mind, it seems like the operation of the computer system can be increased even more by embedding the main memory with the main computer chip so it does not take as long for the processor to access it. One way to embed the main memory to the computer chip is to bond it thereto, as in a 3-D package or a 3-D integrated circuit (IC).

Conventional 3-D packages and 3-D ICs both include a substrate with a memory circuit bonded to it by a bonding region positioned therebetween. The memory circuit typically includes lateral memory devices and the processor circuit typically includes lateral active and passive devices. Further, the memory and processor circuits are prefabricated before the bonding takes place. In both the 3-D package and 3-D ICs, the memory and processor devices are connected to large bonding pads included in respective circuits. However, in the 3-D package, the bonding pads are connected together using wire bonds so that the memory and processor circuits can communicate with each other. In the 3-D IC, the bonding pads are connected together using conductive interconnects which extend therebetween. There are several problems, however, with using 3-D packages and 3-D ICs.

One problem is that the use of wire bonds increases the access time between the processor and memory circuits because the impedance of wire bonds and large contact pads is high. The contact pads are large in 3-D packages to make it easier to attach the wire bonds thereto. Similarly, the contact pads in 3-D ICs have correspondingly large capacitances which also increase the access time between the processor and memory circuits. The contact pads are large in 3-D ICs to make the alignment between the lateral memory devices in the memory circuit, the lateral active and passive devices in the processor circuit, and the conductive interconnects extending therebetween easier. These devices need to be properly aligned with each other and the interconnects because they are fabricated before the bonding takes place. Another problem is that the use of wire bonds is less reliable because the wire bonds can break and become detached.

Another problem with using 3-D packages and 3-D ICs is cost. The use of wire bonds is expensive because it is difficult to attach them between the processor and memory circuits and requires expensive equipment. Further, it requires expensive equipment to align the various devices in the 3-D IC. The bonding and alignment is made even more difficult and expensive because of the trend to scale devices to smaller dimensions.

As mentioned above, the SRAM cells are larger and expensive, so increasing the number of them in the memory circuit would increase the cost of the computer chip dramatically. DRAM cells are less expensive and smaller, but to include them in the memory circuit will still increase the cost. One reason the costs increase for both embedded SRAM and DRAM cells is because they both use a number of masks to fabricate them.

One problem with using lateral memory devices in the memory circuit is their size. The size of a conventional SRAM cell is about 70-120 $F^2$ and the size of a conventional DRAM memory cell is about 15 $F^2$. As is known in the art, 1 F is the minimum photolithographic feature size. For example, if the computer chip is being fabricated using 90 nm lithography, then 1 F corresponds to 90 nm and 1 $F^2$ corresponds to an area that is 90 nm by 90 nm in size. If the computer chip is being fabricated using 60 nm lithography, then 1 F corresponds to 60 nm and 1 $F^2$ corresponds to an area that is 60 nm by 60 nm in size. Hence, to increase the number of memory cells in the memory circuit, the DRAM or SRAM cells would have to be scaled to smaller dimensions, but this requires advances in lithography and increasingly expensive manufacturing equipment. Further, the DRAM and SRAM cells become less accurate and reliable when scaled to smaller dimension.

Accordingly, it is highly desirable to provide new structures and methods for fabricating computer chips which operate faster and are cost effective to fabricate.

BRIEF SUMMARY OF THE INVENTION

The present invention provides a method of coupling substrates together which includes providing first and second substrates, wherein both the first and second substrates have a conductive bonding region formed thereon; and coupling the first and second substrates together with the conductive bonding regions, wherein one of the substrates carries devices and an interconnect region, and the other substrate carries a stack of doped semiconductor layers.

The present invention provides a method of coupling substrates together which includes providing a first substrate with a nonconductive or partially nonconductive bonding region coupled to it; providing a second substrate with a conductive bonding region coupled to it; and bonding the surface of the conductive bonding region to the first substrate so that the conductive bonding region and the first substrate are coupled together, wherein one of the substrates carries devices and an interconnect region, and the other substrate carries a stack of doped semiconductor layers.

The present invention provides a method of coupling substrates together which includes providing first and second substrates, wherein both the first and second substrates have a nonconductive bonding region formed thereon; and coupling the first and second substrates together with the nonconductive bonding regions, wherein one of the substrates carries devices and an interconnect region, and the other substrate carries a stack of doped semiconductor layers.

The present invention provides a method of forming a circuit which includes providing first, second, and third substrates, each having a corresponding bonding region formed thereon; and forming a bond between the bonding surfaces using the third substrate as a handle substrate so that the first and second substrates are coupled together, wherein one of the substrates carries devices and an interconnect region, and the other substrate carries a stack of doped semiconductor layers.

These and other features, aspects, and advantages of the present invention will become better understood with reference to the following drawings, description, and claims.

DETAILED DESCRIPTION OF THE INVENTION

Figure 1:
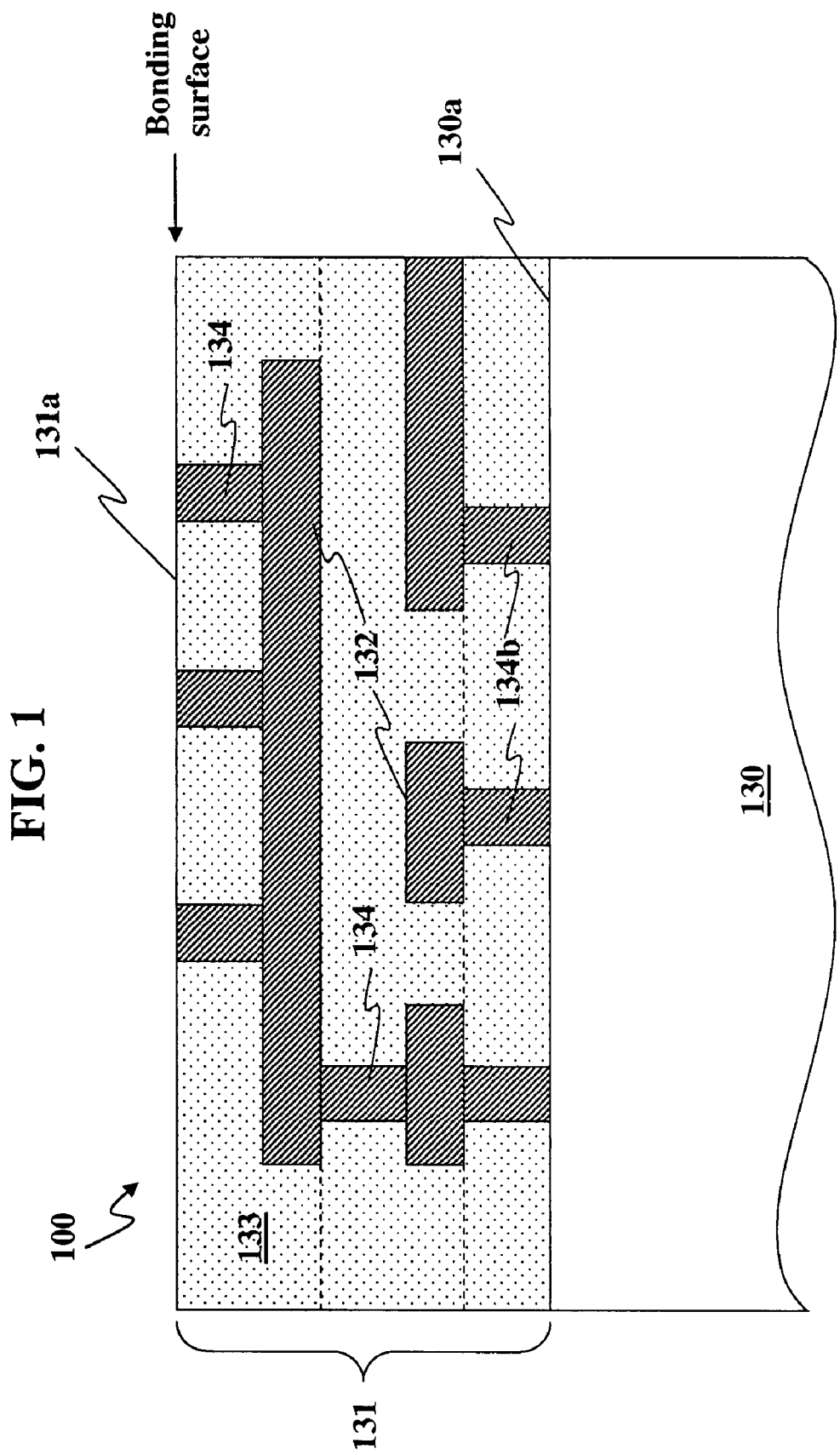
FIGS. 1-23 are sectional views of steps in fabricating an integrated circuit using a semiconductor bonding transfer method.

FIGS. 1-23 are sectional views of steps in fabricating circuitry 100 using a semiconductor bonding transfer method. It should be noted that in the following figures, like reference characters indicate corresponding elements throughout the several views. In this embodiment, circuitry 100 includes separate portions in which it is desired to bond them together. As will be discussed in more detail below, one portion is carried by an acceptor substrate and another portion is carried by a donor substrate. The portion carried by the donor substrate is bonded to the portion carried by the acceptor substrate and then the donor substrate is removed. It should be noted that the portions carried by the donor and acceptor substrates can have many different configurations, but only a few are discussed herein.

The portions carried by the acceptor substrate are shown in FIGS. 1-5 and the portions carried by the donor substrate are shown in FIGS. 6-12. In this embodiment, the donor and acceptor substrates include single crystalline material which can have defects, but is generally better material quality than amorphous or polycrystalline material. However, the material of the donor and acceptor substrates can also include other materials, such as gallium arsenide, indium phosphide, and silicon carbide, among others.

Circuitry 100 is formed using a wafer bonding method which has several advantages. One advantage is that circuitry 100 includes more electronic devices in a given volume because the devices extend laterally across the acceptor substrate as well as above it. This reduces manufacturing costs because the mask set used to fabricate the devices is less complicated. The mask set is less complicated because the devices positioned above the acceptor substrate can be formed with a different mask set than the devices formed on the acceptor substrate. The cost is further reduced because the yield increases. The yield increases because the die size decreases so that fewer chips will be defective. Still another advantage is that the donor substrate does not have to be aligned very accurately with the acceptor substrate when bonding them together. This is because the donor substrate includes blanket layers of semiconductor materials and the devices formed therewith are formed after the bonding has taken place.

In FIG. 1, partially fabricated circuitry 100 includes an acceptor substrate 130 which typically carries electronic devices, such as MOSFETs (Metal-Oxide-Semiconductor Field Effective Transistor), bipolar transistors, diodes, capacitors, and/or resistors, which are known in the art. However, these electronic devices are not shown here for simplicity and ease of discussion. The electronic devices can extend into substrate 130 and/or extend out of substrate 130 through a surface 130a. It should be noted that acceptor substrate 130 can have portions doped n-type or p-type and some portions of it can even be undoped or compensated.

An interconnect region 131 is positioned on surface 130a. Here, interconnect region 131 includes an ILD (InterLayer Dielectric) region 133 with one or more interconnects extending therethrough. The interconnect typically includes one or more interconnect lines 132 and/or conductive vias 134. Lines 132 and vias 134 extend therethrough region 131 between surface 130a and a surface 131a of region 131. Contacts 134b are coupled to the electronic devices carried by substrate 130 and extend upwardly from surface 130a. ILD region 133 can be formed using many different methods, such as CVD (Chemical Vapor Deposition) and SOG (Spin On Glass). Interconnect lines 132 and vias 134 include conductive materials, such as aluminum, copper, tungsten, tungsten silicide, titanium, titanium silicide, tantalum, and doped polysilicon.

Figure 2:
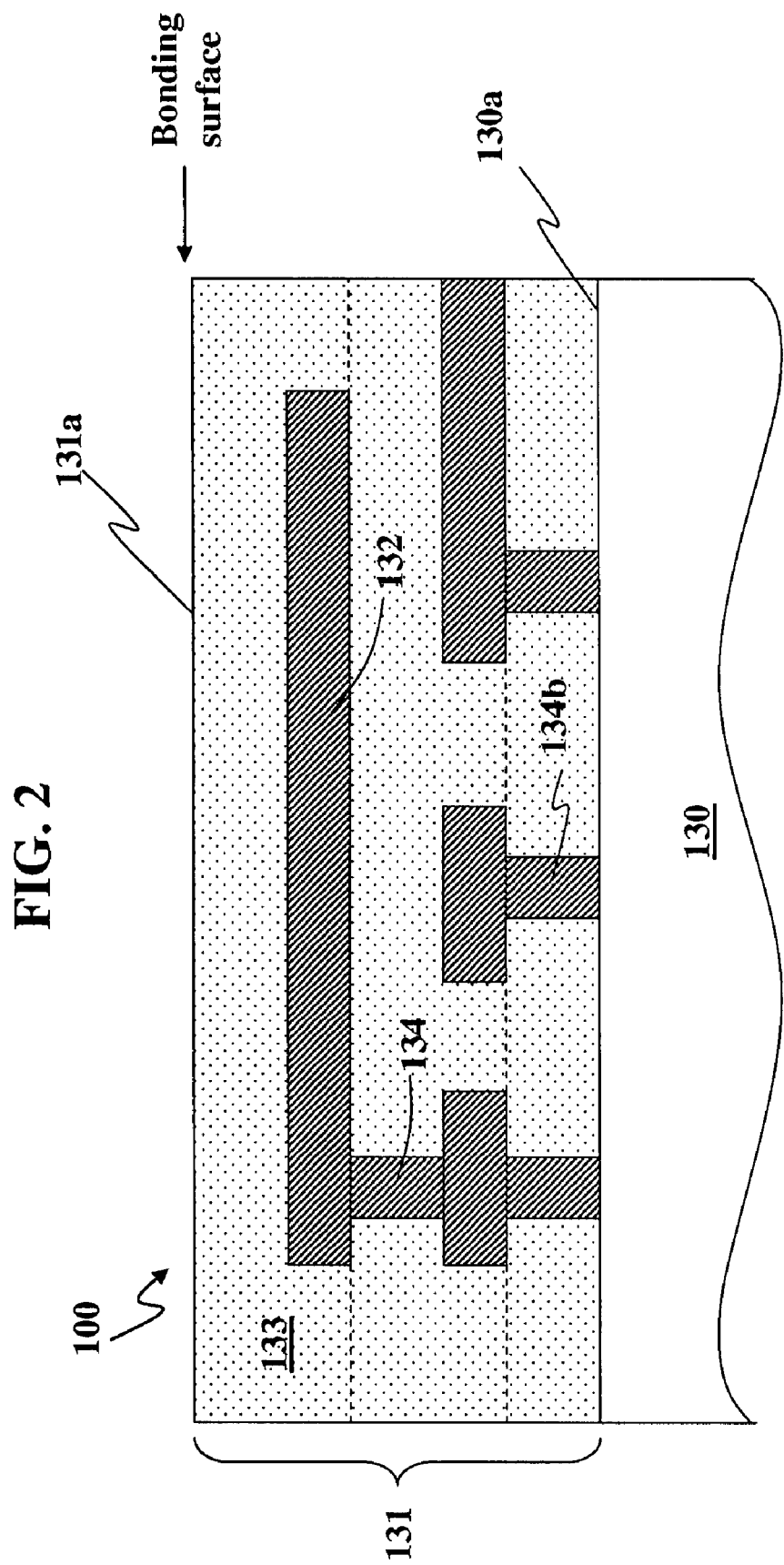
Figure 3:
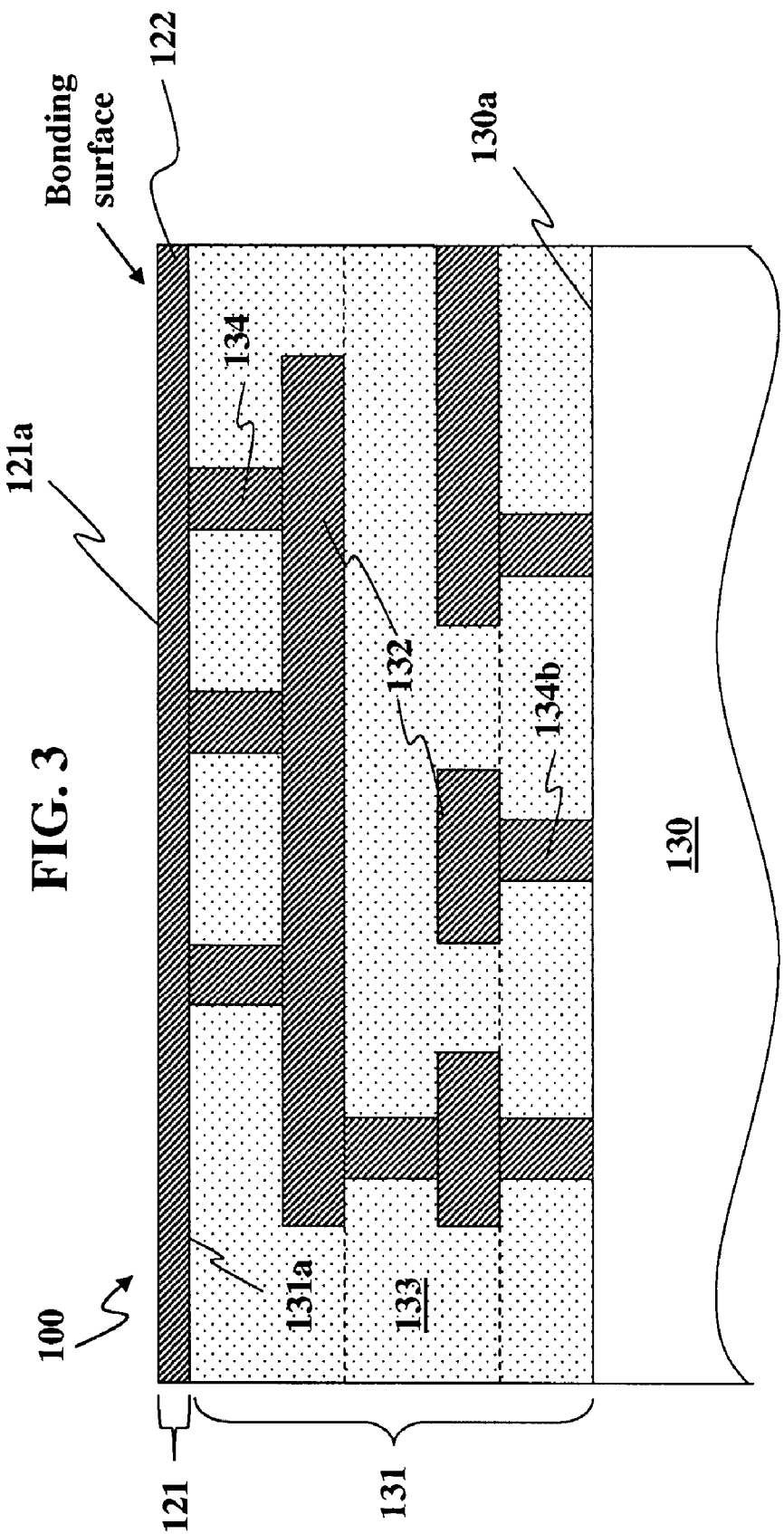

Interconnect region 131 can have many different structures other than that shown in FIG. 1. For example, surface 131a can be defined by ILD region 133 and vias 134 at this step in the fabrication of circuitry 100. FIG. 2 shows an example of circuitry 100 wherein surface 131a is defined by ILD region 133 only and is not in contact with either vias 134 or interconnect lines 132. In FIG. 3, vias 134 adjacent to surface 131a are electrically coupled to a contact region 121 carried by interconnect region 131 on surface 131a. Hence, interconnect lines 132, contacts 134b, and vias 134 are coupled together through interconnect region 131 so that one or more signals can flow between the electronic devices carried by substrate 130 and contact region 121. Contact region 121 includes a conductive layer 122 as will be discussed in more detail below. Conductive layer 122 defines surface 121a and includes a material with a low resistivity so that current can flow therethrough. The material can be the same or similar to the materials included in lines 132 or vias 134.

Figure 4:
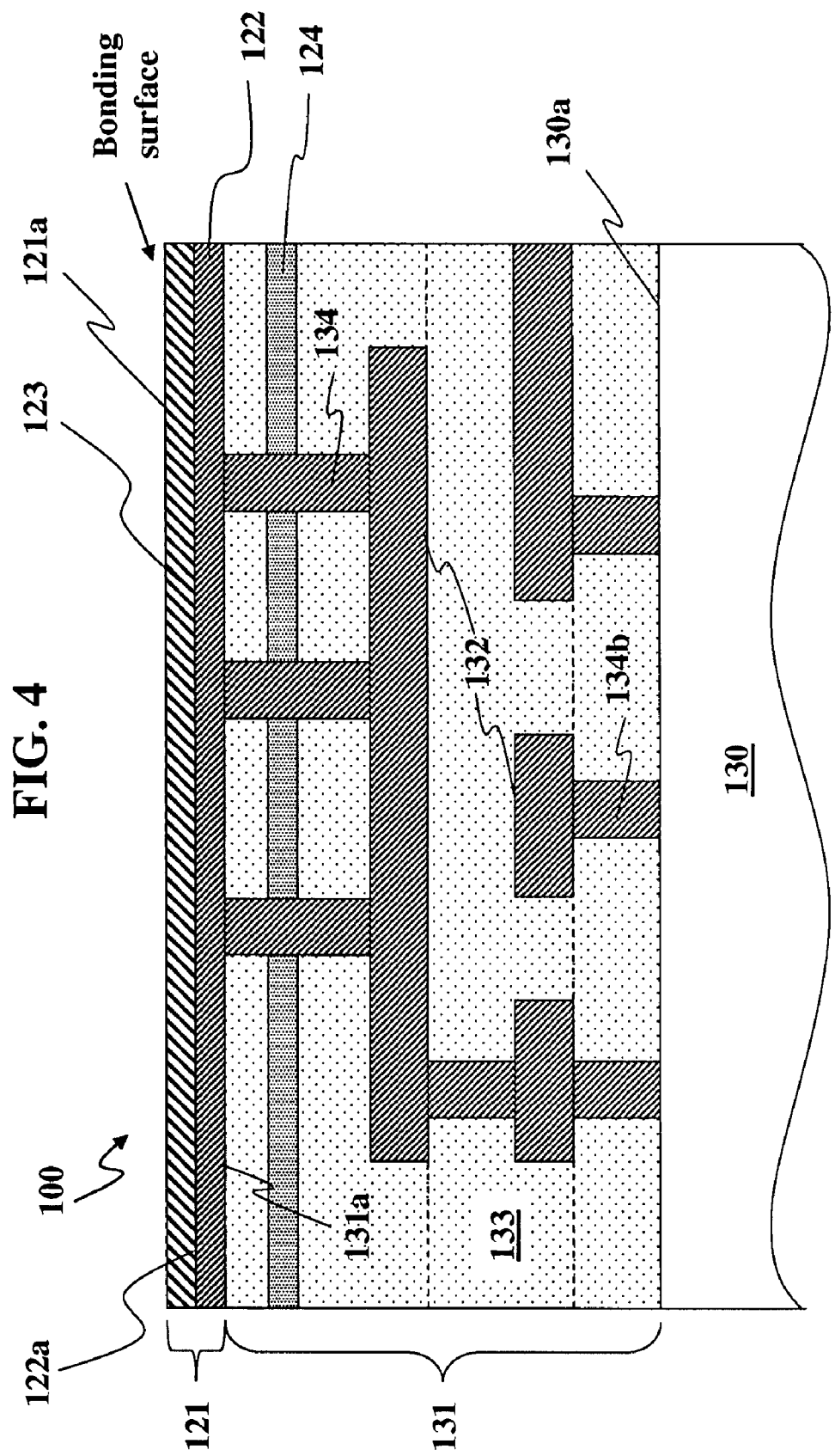

It should be noted that interconnect region 131 can include a blocking region 124, as shown in FIG. 4, which blocks the flow of oxygen from vapor and/or oxygen gas through interconnect region 131 during device processing. In this example, blocking region 124 extends substantially parallel with surface 131a although it can be at an angle relative to it in other examples. Blocking region 124 can include silicon nitride (SiN) or polyamide, for example, or other materials which prevent the flow of contaminants through interconnect region 131.

Figure 5:
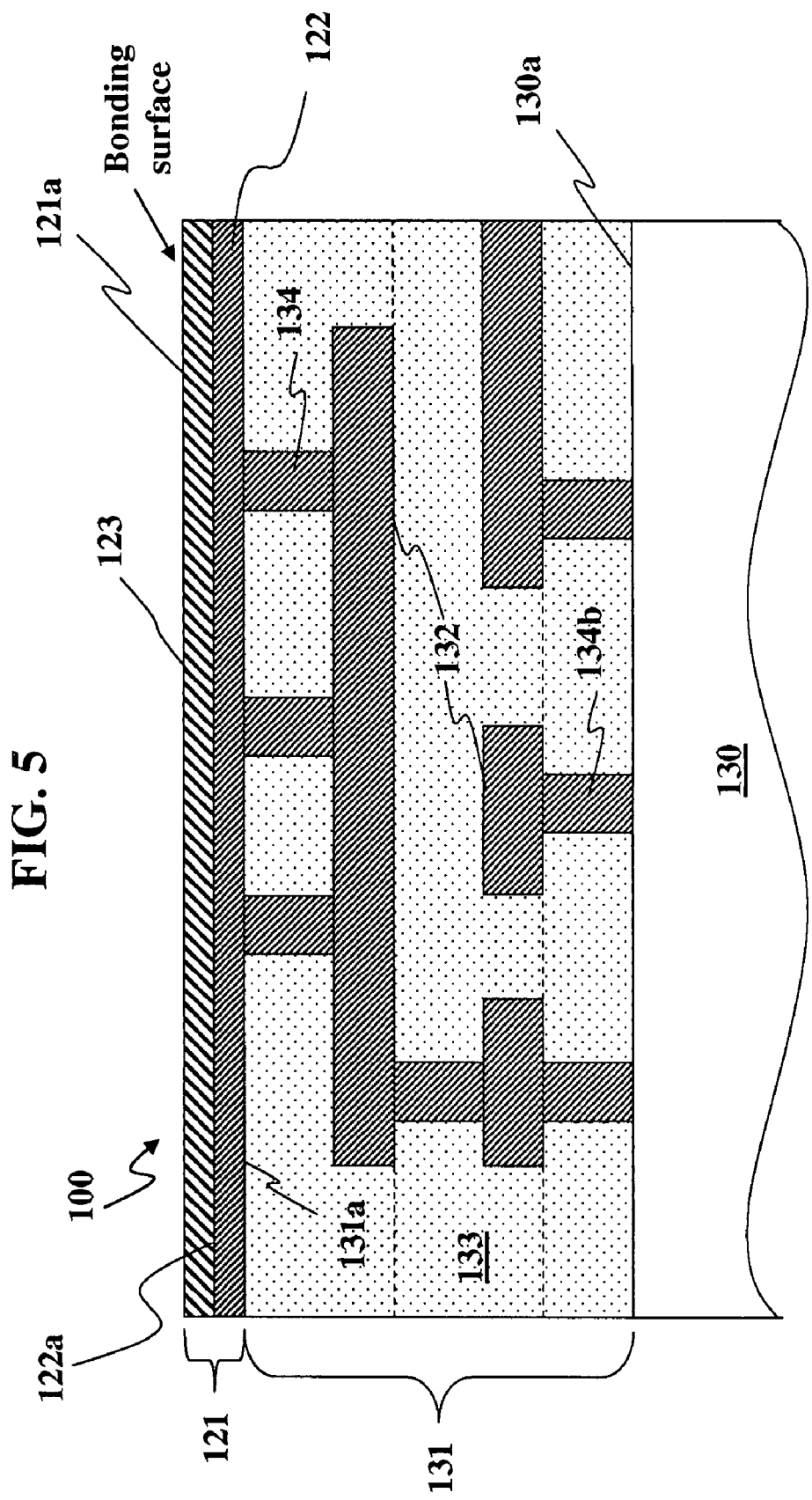

In some embodiments, contact region 121 can include one or more layers of materials. For example, in FIG. 3, contact region 121 is shown as one layer which includes conductive layer 122. In another example, contact region 121 includes a conductive glue layer 123 positioned on a surface 122a of region 122 so that region 121 includes two layers, as shown in FIGS. 4 and 5. In FIGS. 4 and 5, surface 121a is defined by conductive glue layer 123. Conductive glue layer 123 includes a conductive material with a low resistivity and it can have a lower melting point than conductive layer 122 so that its surface 121a can be reflowed at an elevated temperature without negatively impacting the material properties of conductive layer 122, connect layer 123, interconnect lines 132 and/or vias 134. The material in layer 122 can also be soft so that it can more easily bond to other layers positioned thereon with fewer defects, such as micro-voids. In other embodiments, however, contact region 121 is optional, as shown in FIG. 1, where surface 131a of interconnect region 131 can be used as the bonding surface.

Figure 6:
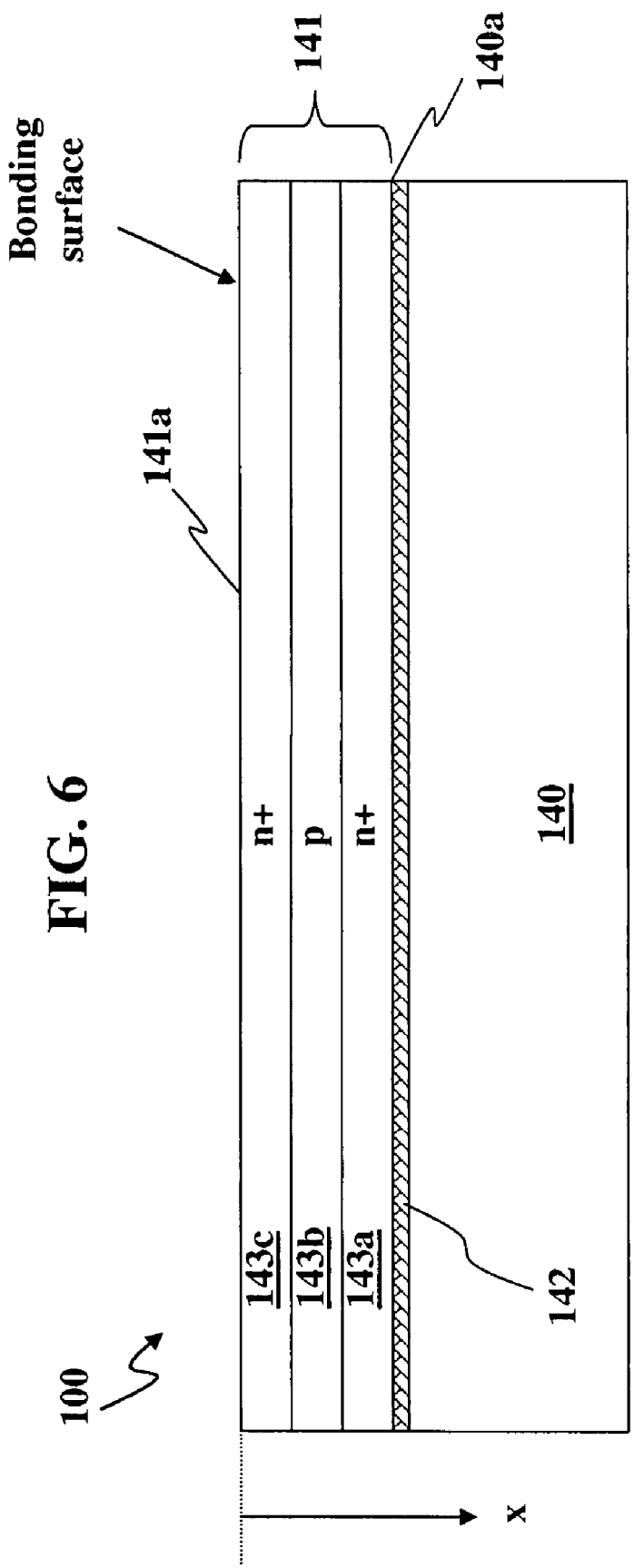

FIG. 6 shows the portion of circuitry 100 that is carried by the donor substrate. Here, partially fabricated circuitry 100 includes a donor substrate 140 which can include silicon or another semiconductor material. In this embodiment, substrate 140 includes a device structure 141 positioned on a surface 140a of substrate 140 and a detaching region 142 positioned near surface 140a. Device structure 141 can include various materials and/or stacks of doped semiconductor layers depending on the type of device it is desired to form therewith. Here, device structure 141 includes a stack of doped semiconductor layers for illustrative purposes with the understanding that it can include other layer structures, which includes semiconductors, conductors, and/or dielectrics. Donor substrate 140 and device structure 141 include single crystalline silicon which can have defects, but is generally better material quality compared to amorphous or polycrystalline silicon.

In this particular example, structure 141 includes an n+pn+ stack, although it can have other layer stacks, such as npn, p+np+, and pnp. The n+pn+ stack includes an n+-doped region 143a on surface 140a, a p-doped region 143b on region 143a, and an n+-doped region 143c on region 143b. In this embodiment, regions 143a-143c can be doped by ion implantation, diffusion, or plasma. However, in other embodiments, regions 143a-143c can be doped during growth. More information about forming regions 143a-143c can be found in U.S. Pat. No. 7,470,598, entitled "SEMICONDUCTOR LAYER STRUCTURE AND METHOD OF MAKING THE SAME", which issued on Dec. 30, 2008 to the same inventor, the contents of which are incorporated by reference as though fully set forth herein.

In another example, device structure 141 can include a structure with an n+pn+pnp+ stack of semiconductor layers. In this example, the stack is processed to form a negative differential resistance static random access memory device which includes a transistor and a thyristor. More information about this device structure can be found in a co-pending U.S. patent application Ser. No. 11/092,500, titled "SEMICONDUCTOR MEMORY DEVICE" filed on an even date herewith by the same inventor, the contents of which are incorporated by reference as though fully set forth herein.

Detaching region 142 can be formed in many different ways. For example, it can be formed by implanting hydrogen, forming an anodized porous material layer, or implanting oxygen therein so that it is defective and its mechanical strength and chemical compositions are different from adjacent material regions. As discussed in conjunction with FIGS. 24-27, detaching region 142 can be a glue layer carried by a handle substrate.

Figure 7:
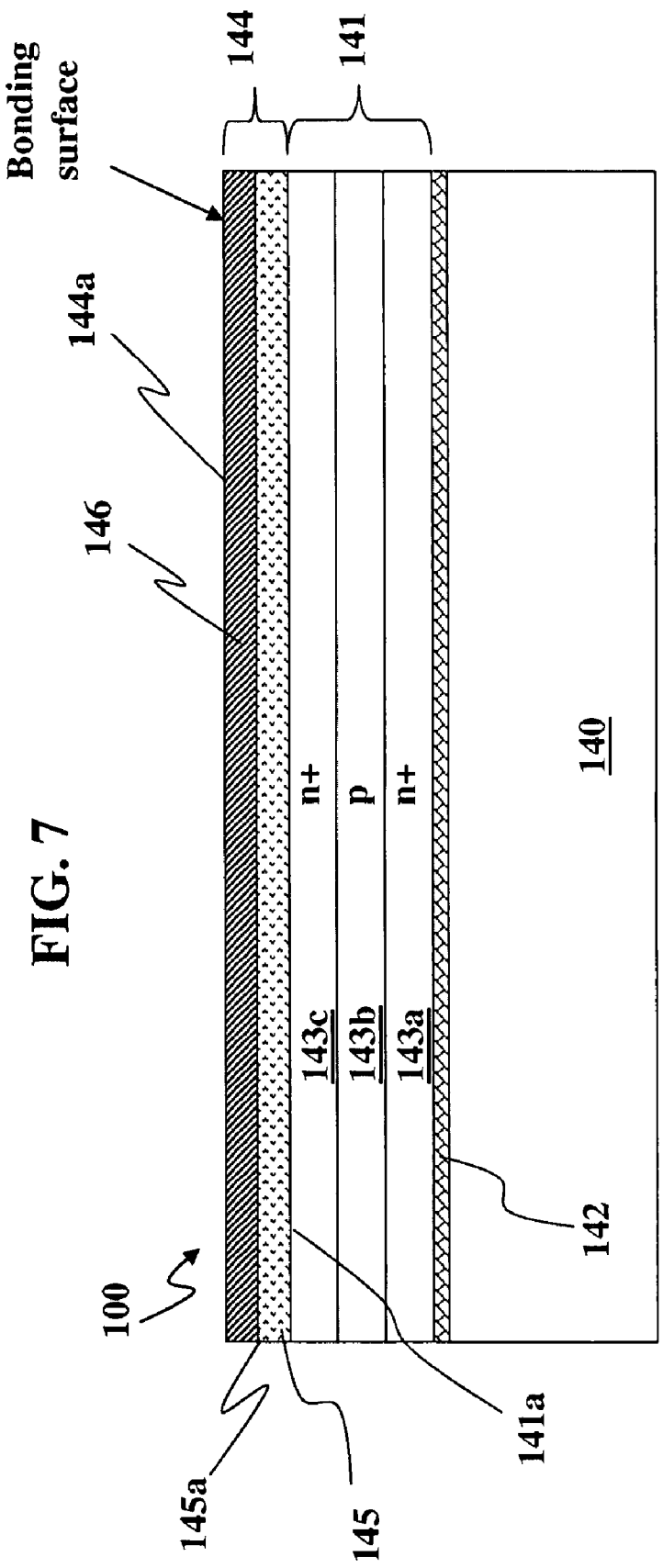

As shown in FIG. 7, a contact region 144 is positioned on a surface 141a of device structure 141. Contact region 144 can have various configurations and can include one or more layers of materials. In this embodiment, region 144 includes a silicide layer 145 positioned adjacent to surface 141a and a conductive layer 146 positioned on a surface 145a of layer 145. Here, layer 146 defines a surface 144a of region 144. In another example shown in FIG. 8, contact region 144 also includes a conductive glue layer 147 positioned on surface 146a so that region 144 includes three layers and surface 144a is defined by layer 147.

Figure 8:
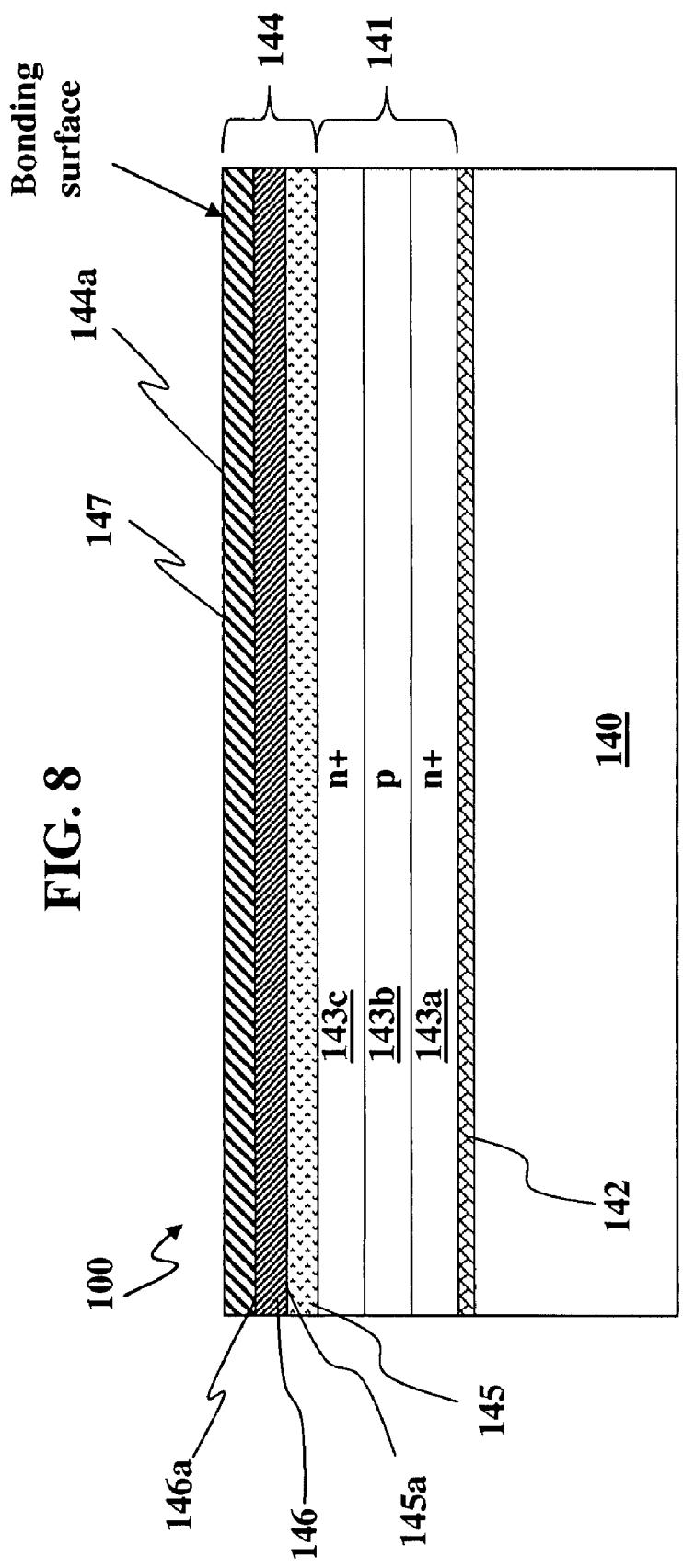
Figure 9:
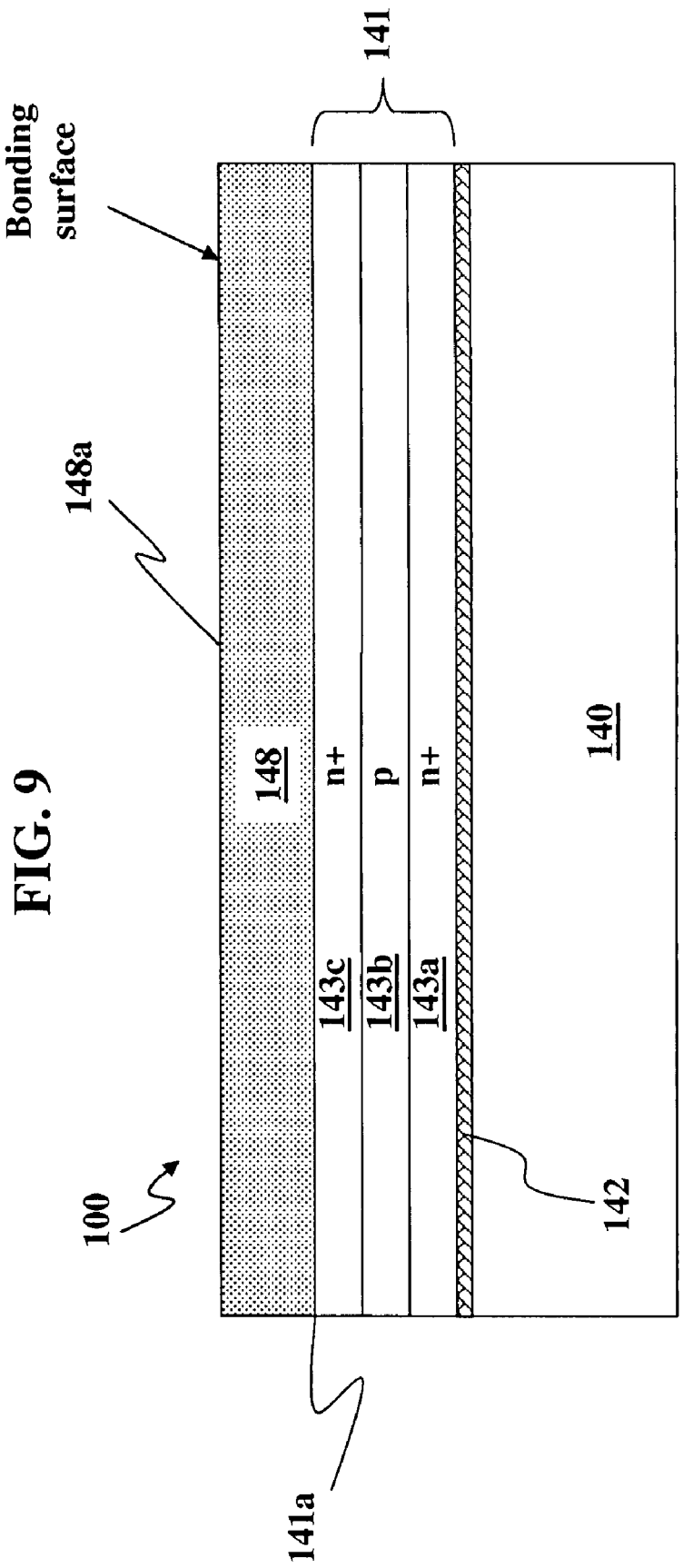
Figure 10:
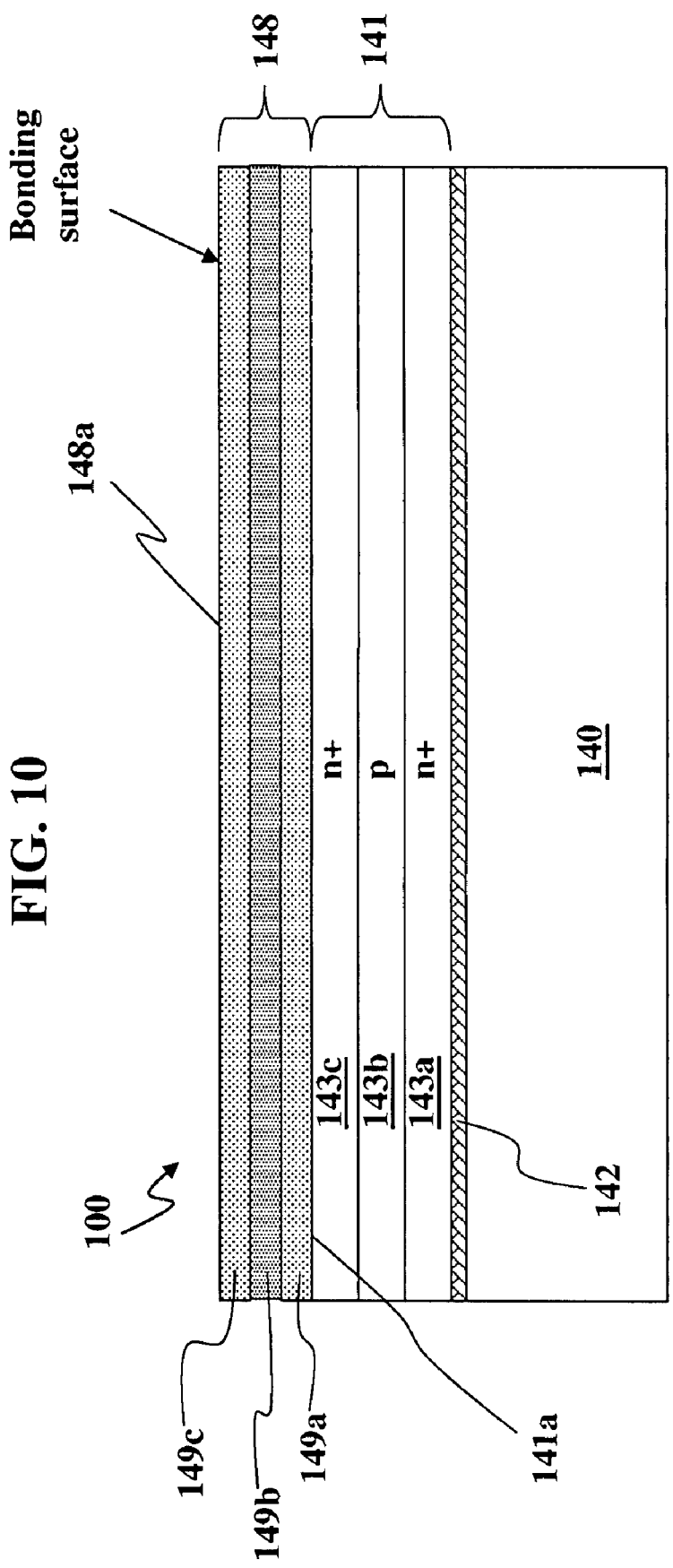
Figure 11:
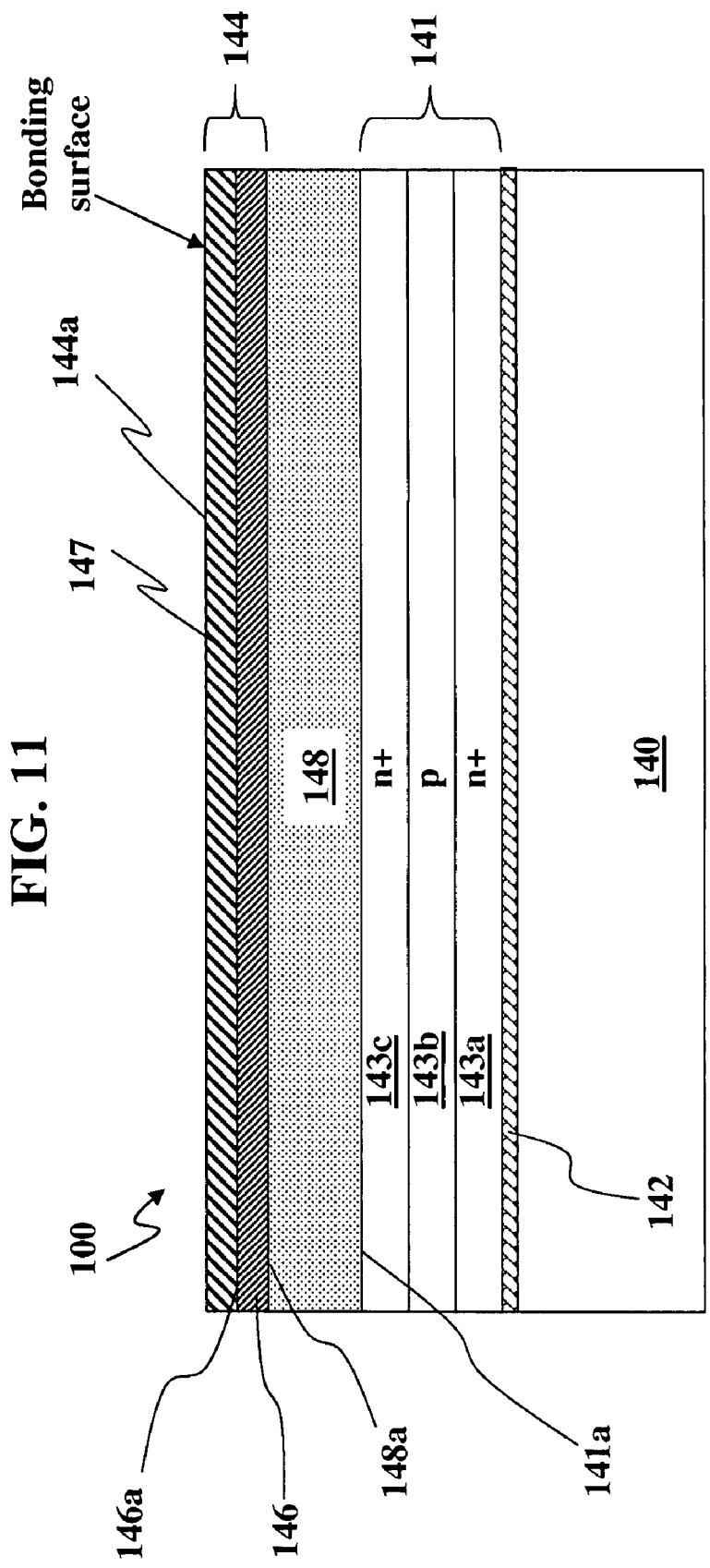

In other embodiments, a dielectric region 148 can be positioned on surface 141a of device structure 141 as shown in FIG. 9, instead of contact region 144, as shown in FIGS. 7 and 8. Dielectric region 148 can include one layer as shown in FIG. 9 or it can include multiple regions. For example, as shown in FIG. 10, dielectric region 148 includes a dielectric layer 149a positioned on surface 141a, a blocking layer 149b positioned on layer 149a, and a dielectric layer 149c positioned on layer 149b. Blocking layer 149b can have the same or similar properties as blocking layer 124 discussed in FIG. 4 above. In FIG. 11, conductive region 144 is positioned on surface 148a of dielectric region 148. Here, contact region 144 includes conductive layer 146 positioned on surface 148a and conductive glue layer 147 positioned on layer 146, as shown in FIG. 7.

Figure 12:
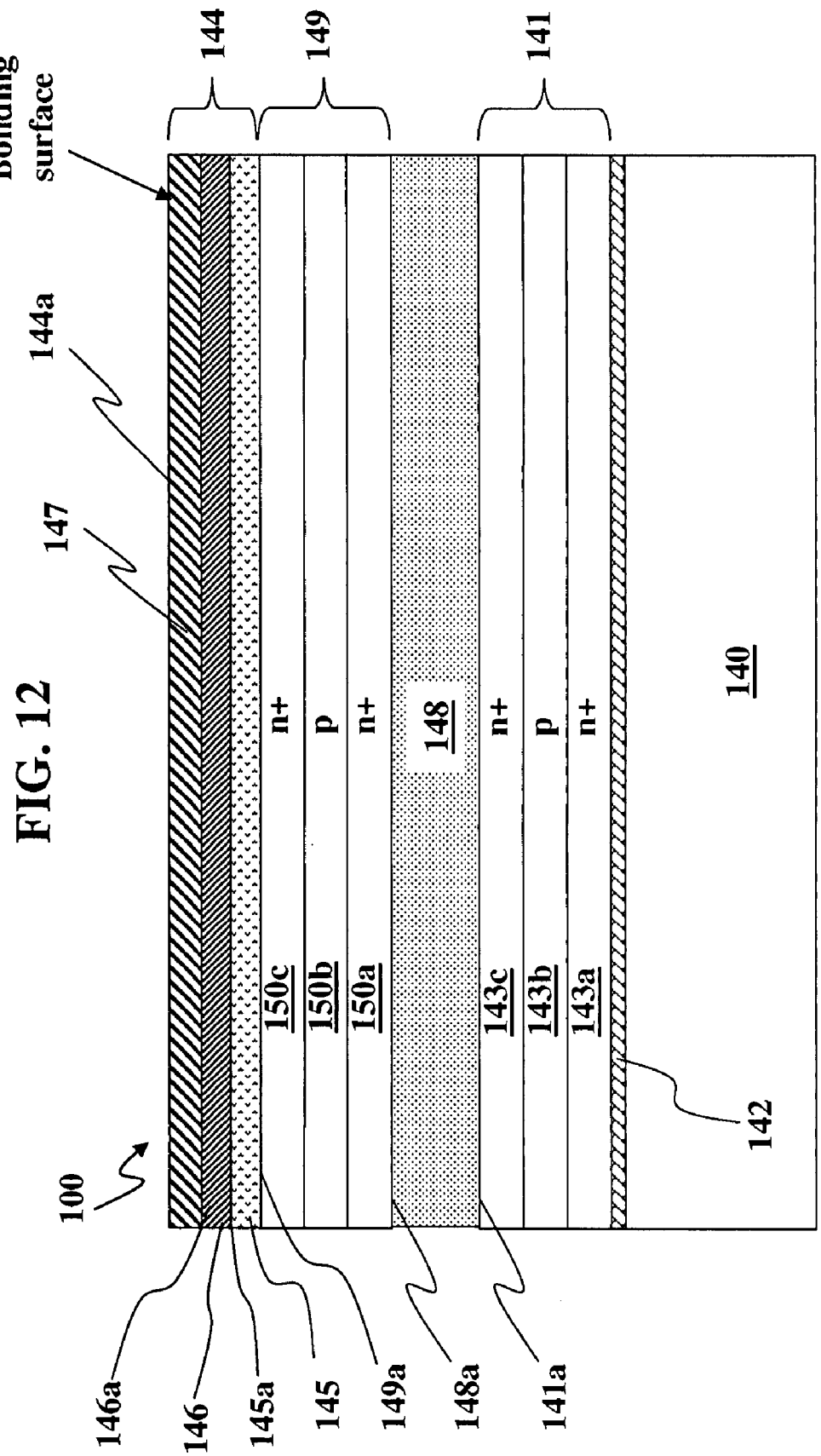

In another embodiment as shown in FIG. 12, a device structure 149 is positioned on surface 148a instead of contact region 144 as in FIG. 11. Device structure 149 can include various material layers depending on the type of device it is desired to form therewith. In this particular example, device structure 149 includes a stack of doped semiconductor layers similar to structure 141 with the understanding that it could include other layer structures. In this particular example, the stack includes an $n^+$-type doped region 150a on surface 148a, a p-type doped region 150b on region 150a, and an $n^+$-type doped region 150c on region 150b. Contact region 144 is then positioned on a surface 149a of device structure 149. Here, contact region 144 is similar to that shown in FIG. 8 where it includes silicide layer 145 positioned adjacent to surface 149a, conductive layer 146 positioned on surface 145a of layer 145, and conductive glue layer 147 positioned on surface 146a of layer 146.

It is desired to couple device structure 141 and/or device structure 149 to the electronic devices carried by substrate 130. As shown in FIGS. 13-20, this can be done with the various configurations of structure carried by the donor and acceptor substrates discussed above. It should be noted that only some of the possible configurations are shown here for simplicity and ease of discussion and that others will become readily apparent to one skilled in the art. Further, the bonding can be done in many different ways. For example, the bonding can include heating the bonding surfaces shown in FIGS. 1-6 and coupling them to the bonding surfaces shown in FIGS. 7-12. More information on wafer bonding can be found in U.S. Pat. No. 7,470,142, entitled WAFER BONDING METHOD, which issued on Dec. 30, 2008 to the same inventor, the contents of which are incorporated by reference as though fully set forth herein.

Figure 13:
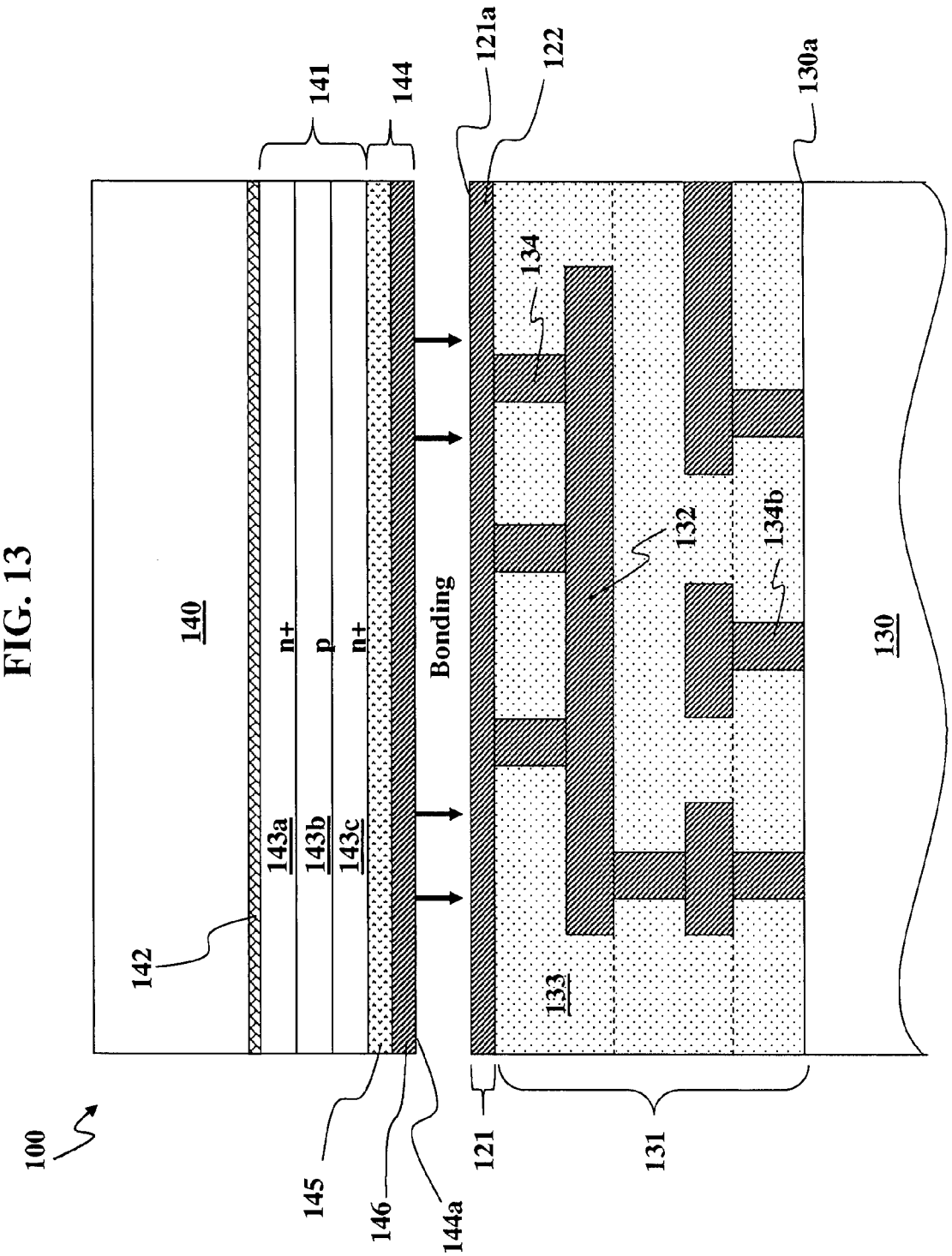

FIG. 13 shows an example where contact region 121 of the structure shown in FIG. 3 is bonded to contact region 144 of the structure shown in FIG. 7, so that surfaces 121a and 144a are adjacent to one another. Regions 121 and 144 can be bonded together in many different ways. For example, layers 122 and/or 144 can be heated so that the material included therein flows together to form the bond.

Figure 14:
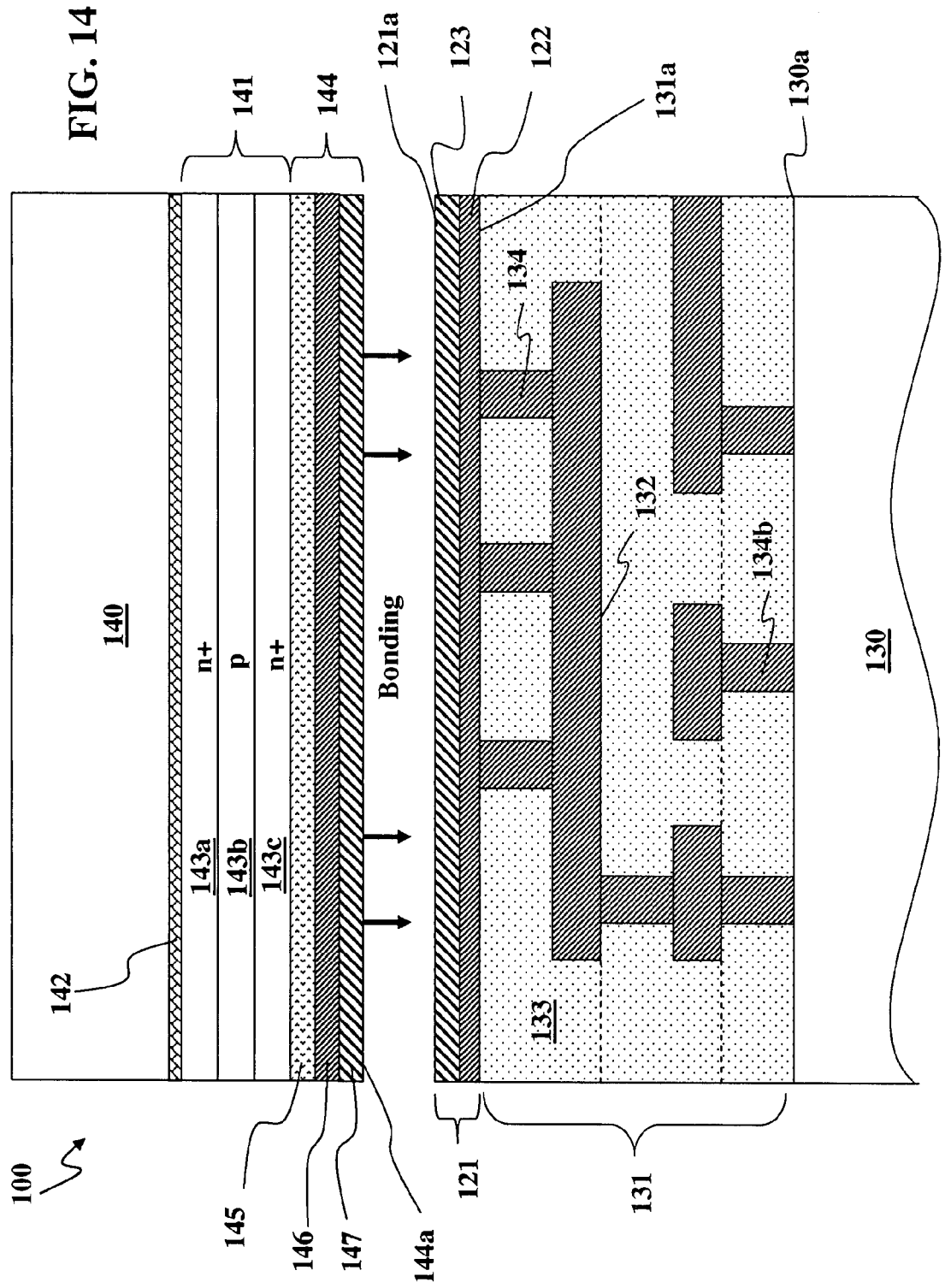
Figure 15:
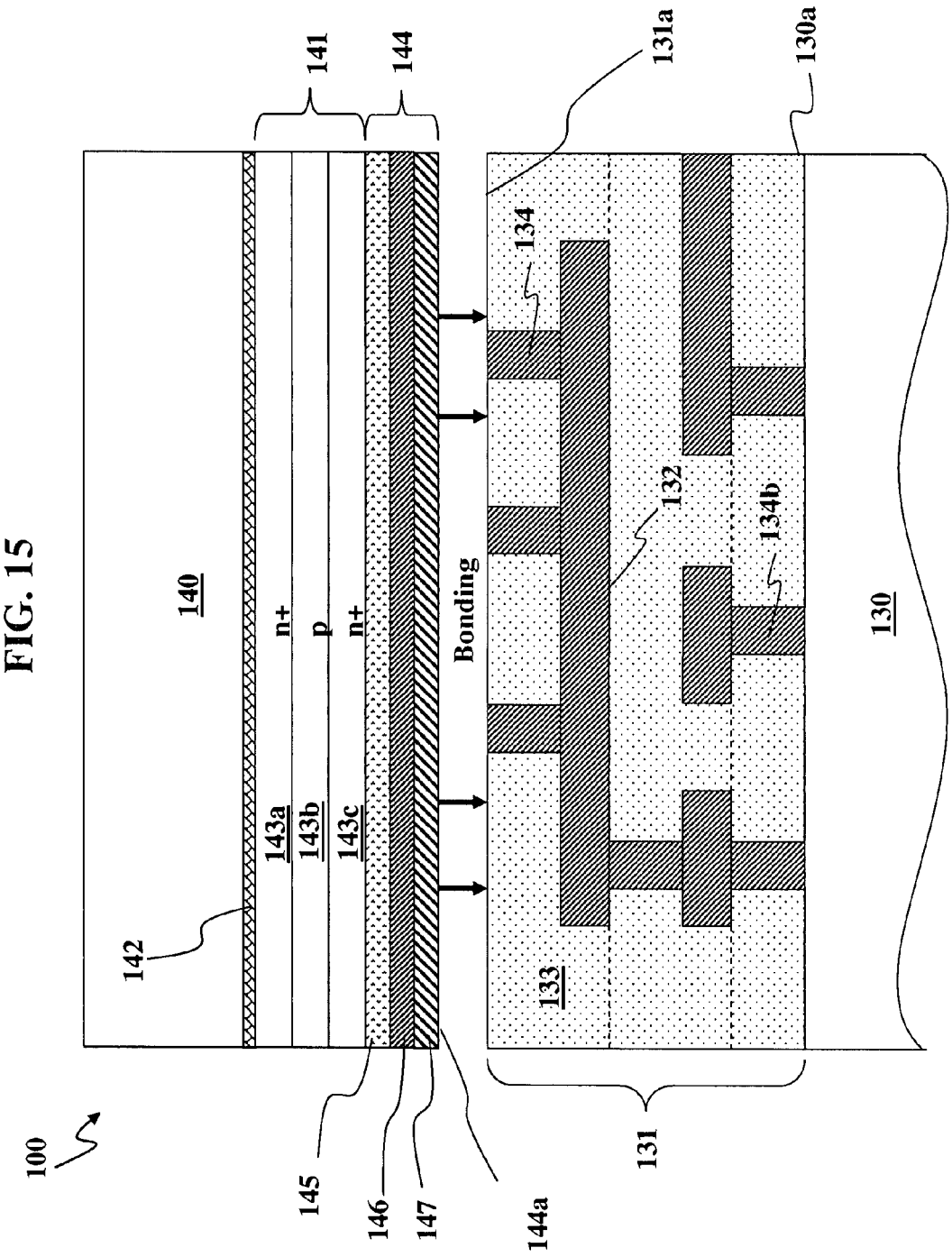
Figure 16:
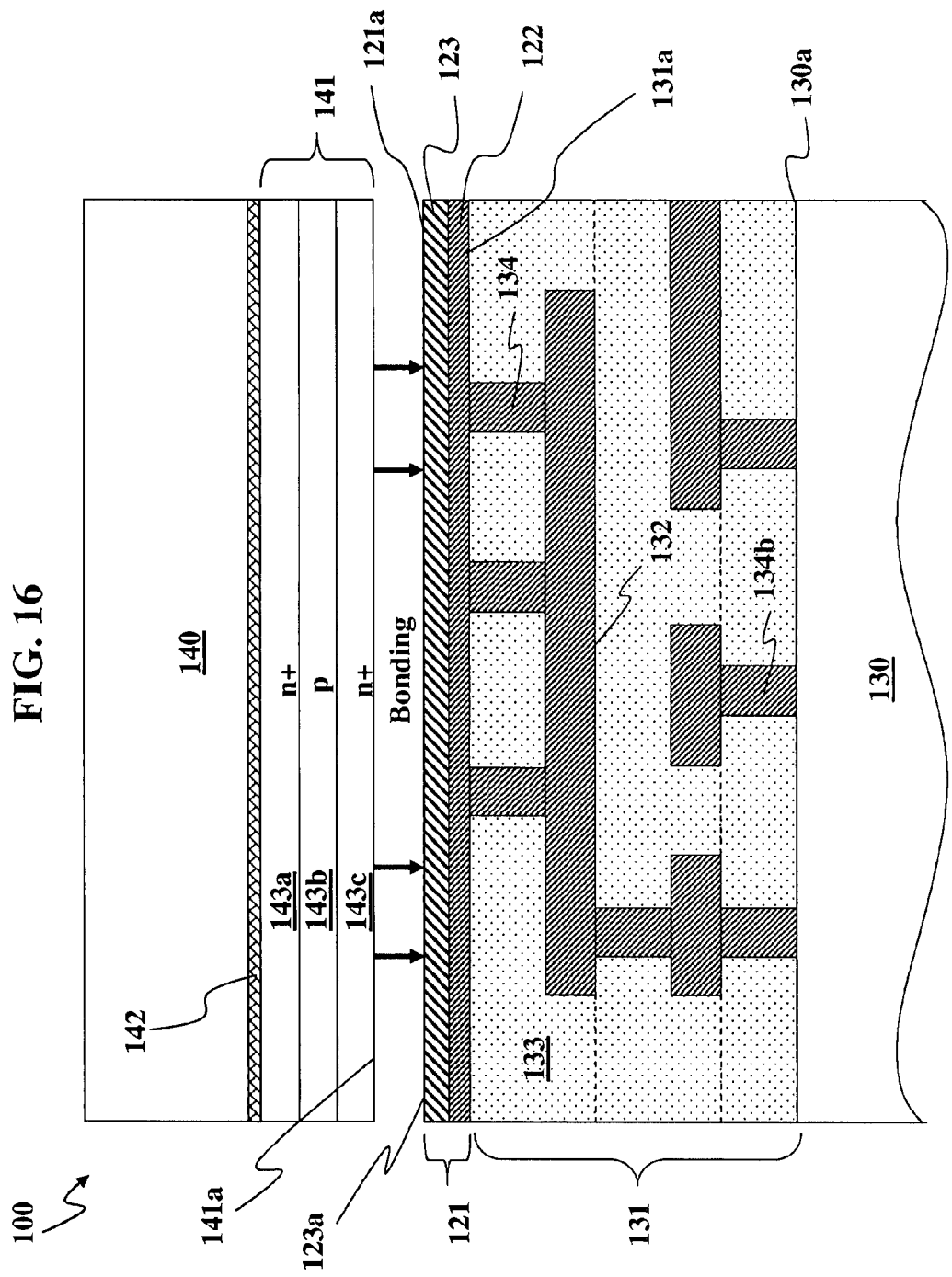

FIG. 14 shows an example where contact region 121 of the structure shown in FIG. 5 is bonded to contact region 144 of the structure shown in FIG. 8, so that surfaces 121a and 144a are coupled together. Here, surfaces 121a and/or 144a can be heated so that the material included in layers 123 and 147 adhere together to form the bond. FIG. 15 shows an example where region 144 of the structure shown in FIG. 8 is bonded to interconnect region 131 of the structure shown in FIG. 1, so that surfaces 131a and 144a are coupled together. FIG. 16 shows an example where conductive glue layer 123 of the structure shown in FIG. 5 is bonded to device structure 141 of the structure shown in FIG. 6, so that surfaces 121a and 141a are adjacent to one another.

Figure 17:
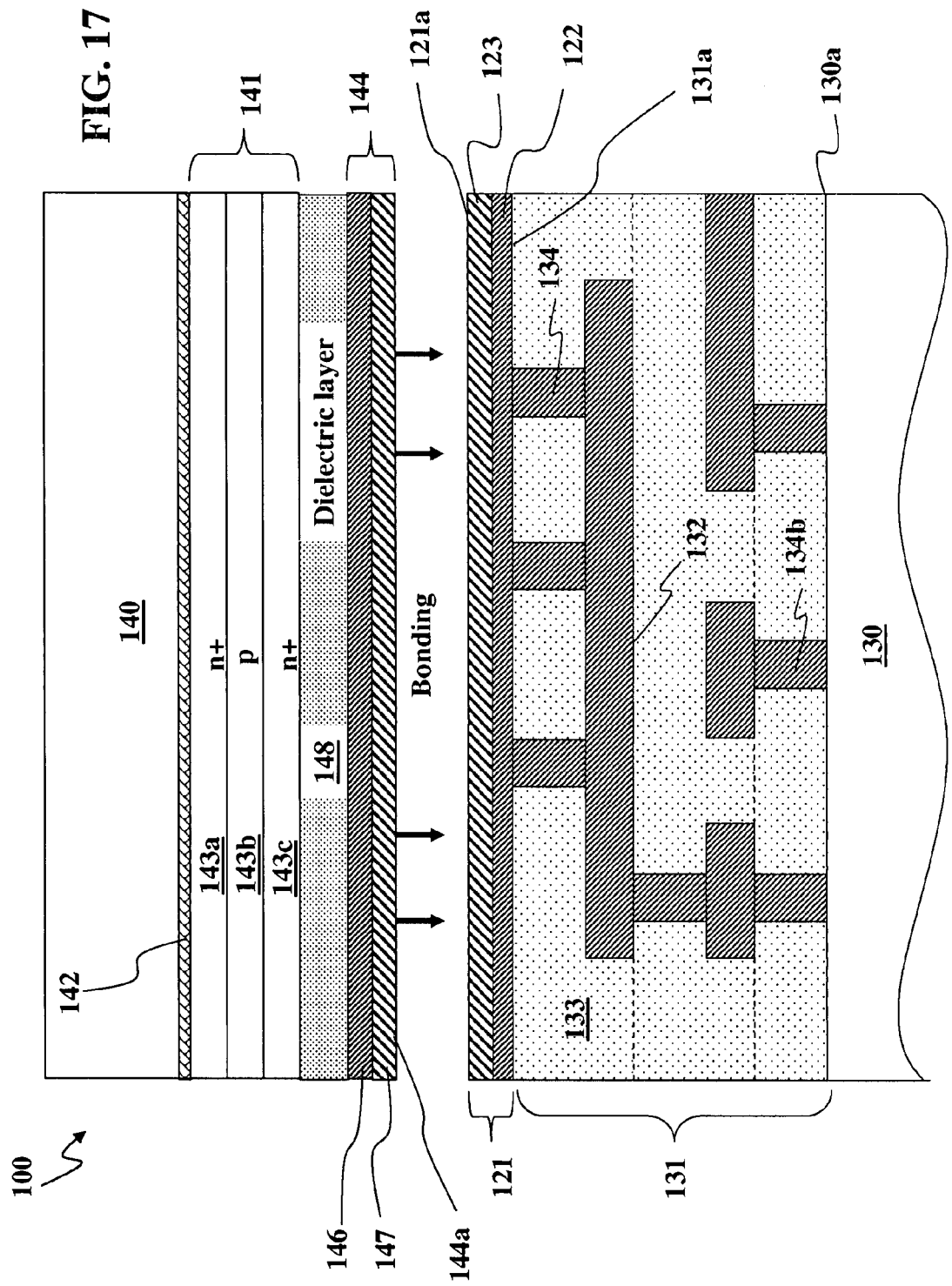
Figure 18:
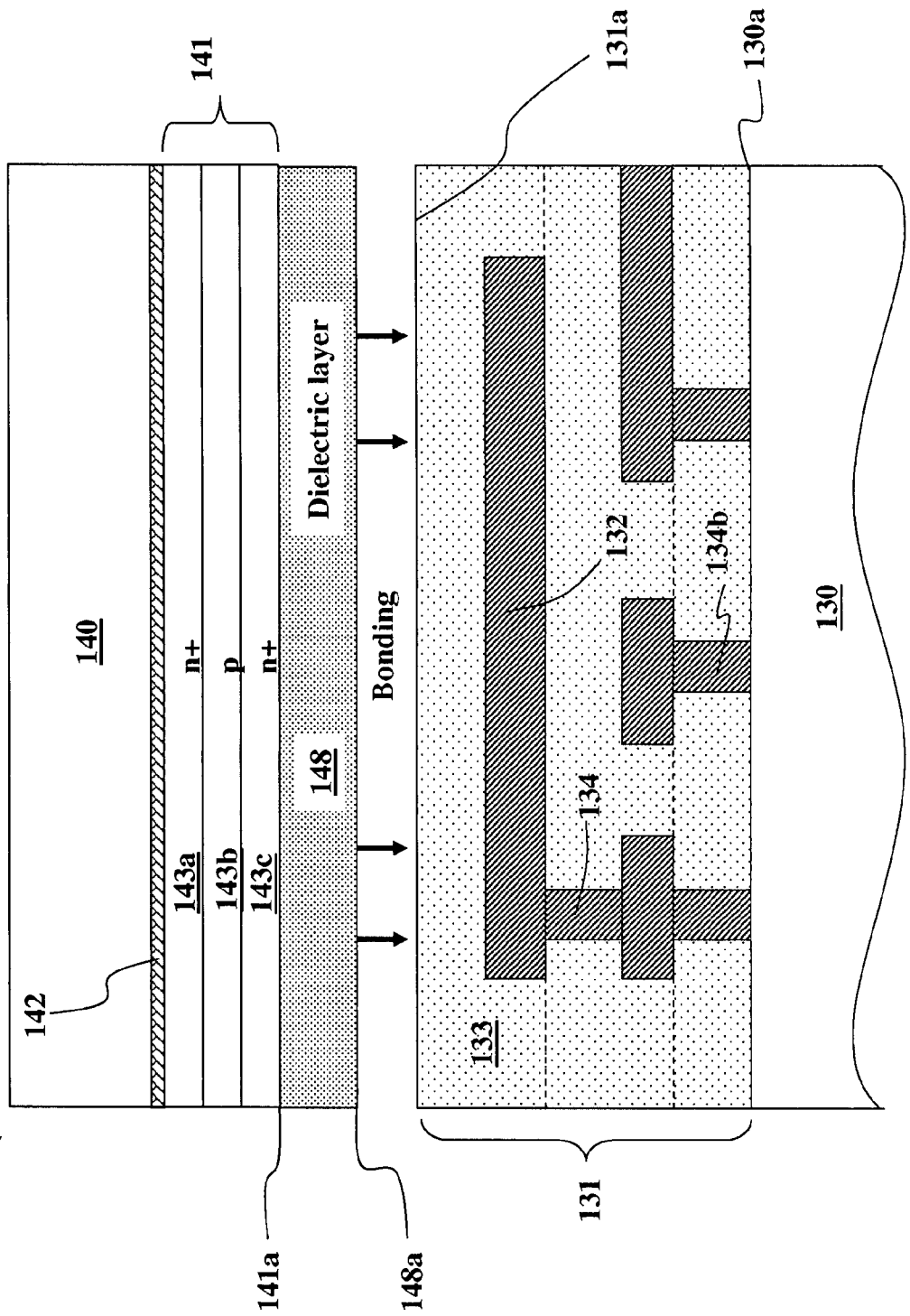

FIG. 17 shows an example where conductive glue layer 123 of the structure shown in FIG. 5 is bonded to conductive glue layer 147 of the structure shown in FIG. 11, so that surfaces 121a and 144a are bonded together. Here, surfaces 121a and/or 144a can be heated so that the material included in layers 123 and 147 adhere together to form the bond. FIG. 18 shows an example where interconnect region 131 of the structure shown in FIG. 2 is bonded to dielectric region 148 of the structure shown in FIG. 9, so that surfaces 131a and 148a are adjacent to one another.

Figure 19:
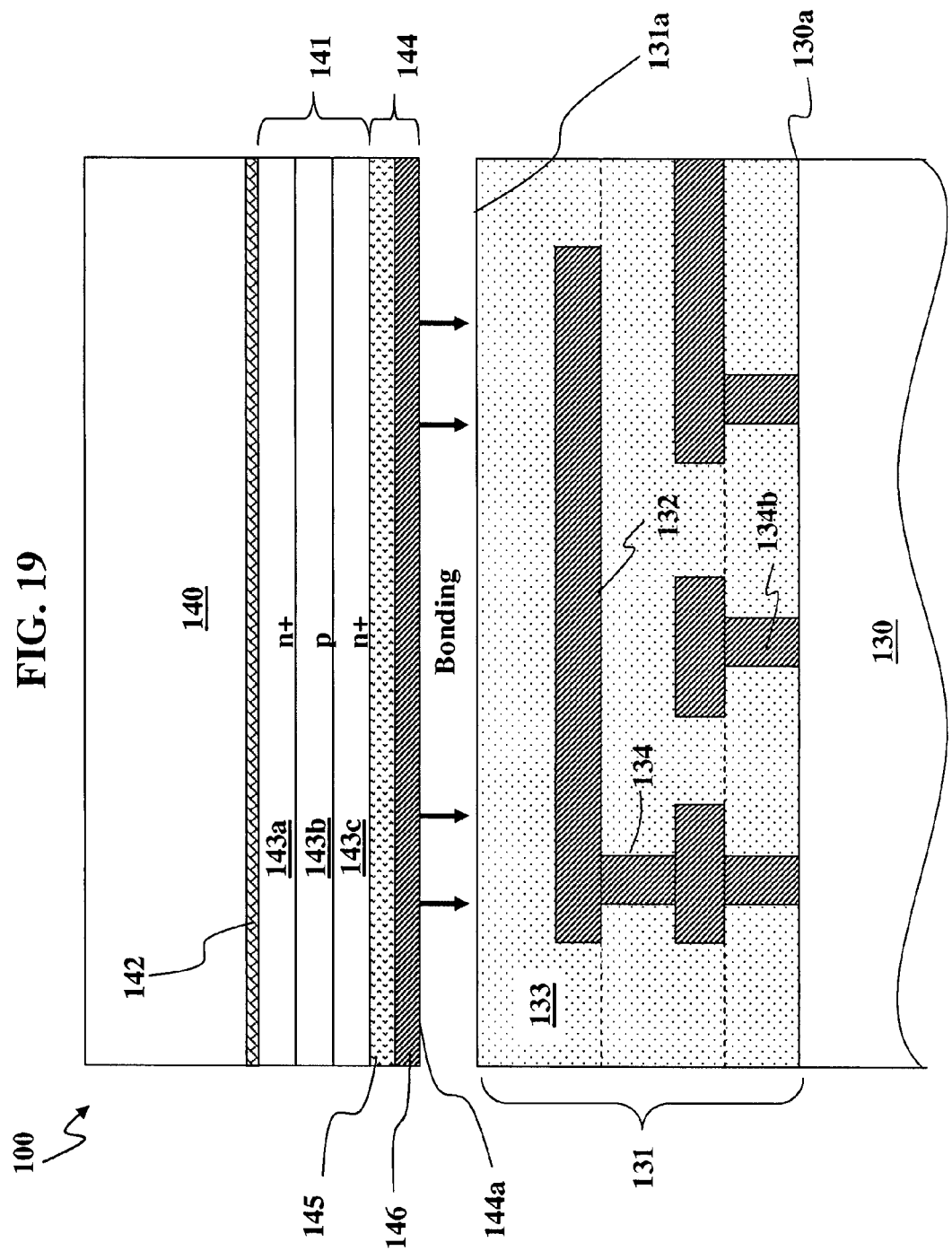

FIG. 19 shows an example where conductive layer 146 of the structure shown in FIG. 7 is bonded to interconnect region 131 of the structure shown in FIG. 2, so that surfaces 131a and 144a are adjacent to one another. Here, surfaces 131a and/or 144a can be heated so that the material included in region 133 and layer 146 adhere together to form a bond. Plasma treatment can be used on bonding surface 131a and/or 148a to increase the bond strength. The plasma treatment reduces the amount of hydrogen on surface 131a and/or 148a. The presence of hydrogen makes the surface hydrophobic and its absence makes the surface hydrophilic. Hydrophilic surfaces tend to form stronger bonds with each other than hydrophobic surfaces.

Figure 20:
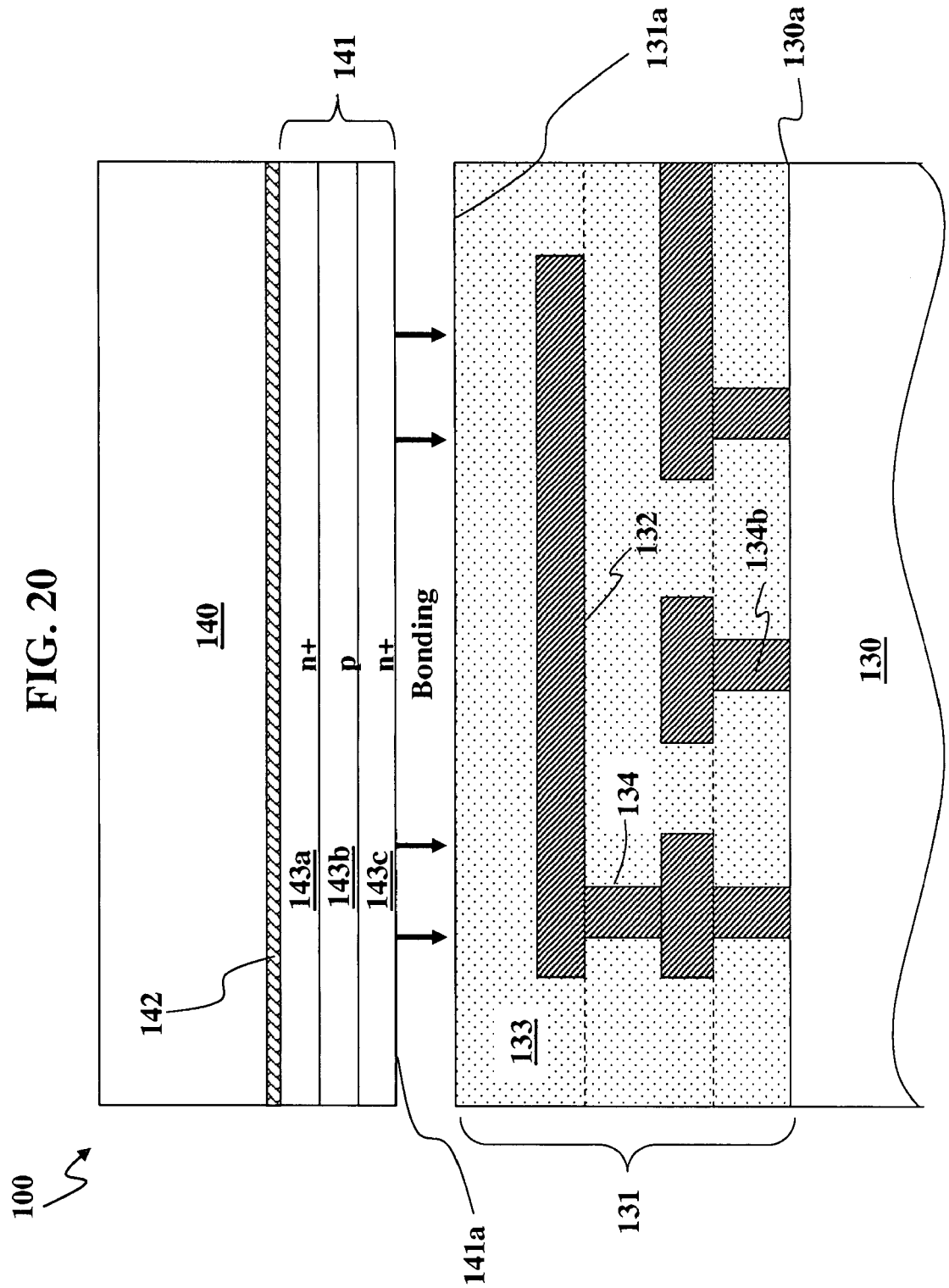

FIG. 20 shows an example where region 141 of the structure shown in FIG. 6 is bonded to interconnect region 131 of the structure shown in FIG. 2, so that surfaces 131a and 141a are adjacent to one another. Plasma treatment can be used on bonding surfaces 131a and/or 141a to increase the bond strength therebetween.

Once device structure 141 or 149 is coupled to the electronic devices carried by acceptor substrate 130 through bonding, it is desirable to remove a portion of donor substrate 140 to leave device structure 141. In the examples discussed below, it is shown that portions of substrate 140 are removed so that device structure 141 can be subsequently processed to form electronic devices therewith. The processing steps involved in the formation of the electronic devices out of device structure 141 includes steps well known in the art, such as lithography, etching, and deposition, among other steps. More details of the processing steps and examples of device structures can be found in co-pending U.S. patent application Ser. No. 11/092,500, titled "SEMICONDUCTOR MEMORY DEVICE" filed on an even date herewith by the same inventor, the contents of which are incorporated by reference as though fully set forth herein.

The devices formed from device structure 141 and/or 151 are typically called "vertical" devices because their layer structure extends substantially perpendicular to surface 131a. In other words, the $n^+pn^+$ layers of region 141 are stacked on top of each other so that current flow through them is substantially perpendicular to surface 131a. This is different from conventional devices which are often called lateral or planar devices. Lateral devices have their layer structure extending horizontally relative to a surface of a material region that carries them. In other words, the $n^+pn^+$ layers included in a lateral device are positioned side-by-side so that current flow through them is substantially parallel to the supporting surface.

Figure 21:
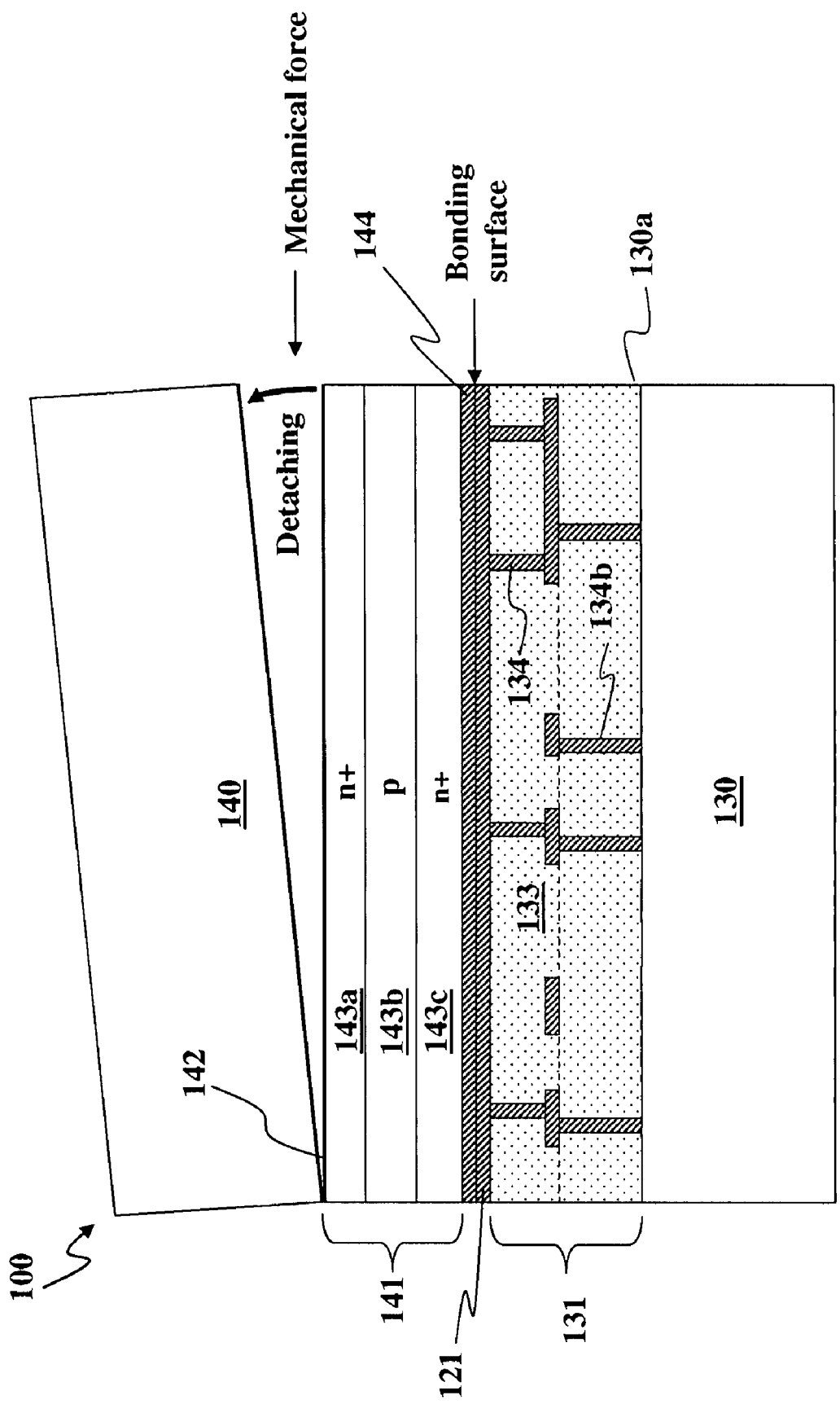

Substrate 140 can be removed in several different ways. In FIG. 21, substrate 140 is removed using mechanical force to cleave along detach region 142. The mechanical force can include driving a wedge through detaching layer 142 so that device structure 141 is carried by acceptor substrate 130 and the rest of substrate 140 is removed. The cleave is facilitated because if layer 142 is formed by hydrogen or oxygen implantation, then the defects from the implantation make it easier to cleave along layer 142. If layer 142 includes an anodized porous material, then it will also have defects which facilitate it being cleaved to separate device structure 141 from substrate 140. The mechanical force can also include using a water jet to flow a high velocity stream of water or another liquid at and along detaching layer 142 so that substrate 140 and structure 141 are separated.

Figure 22:
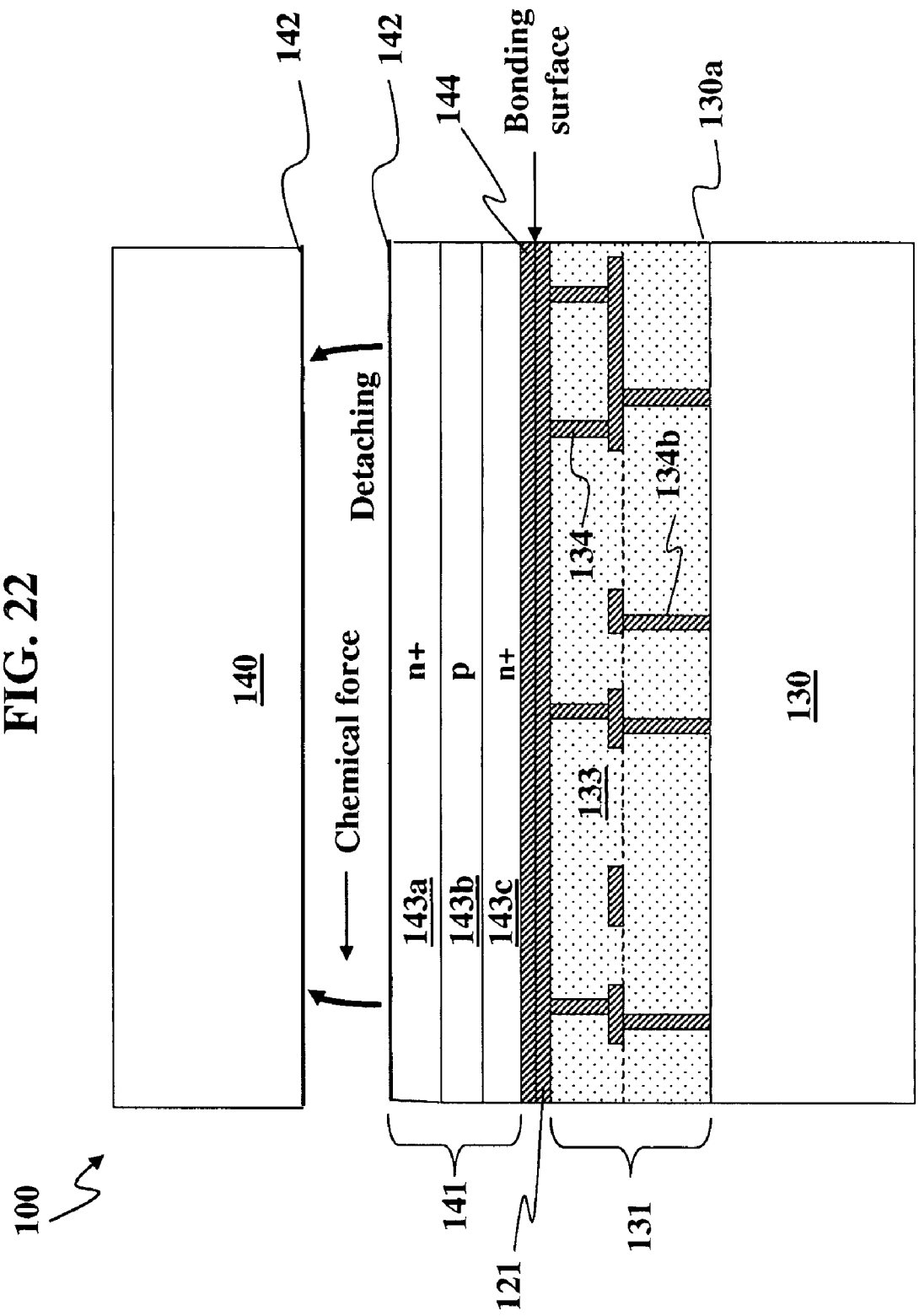
Figure 23:
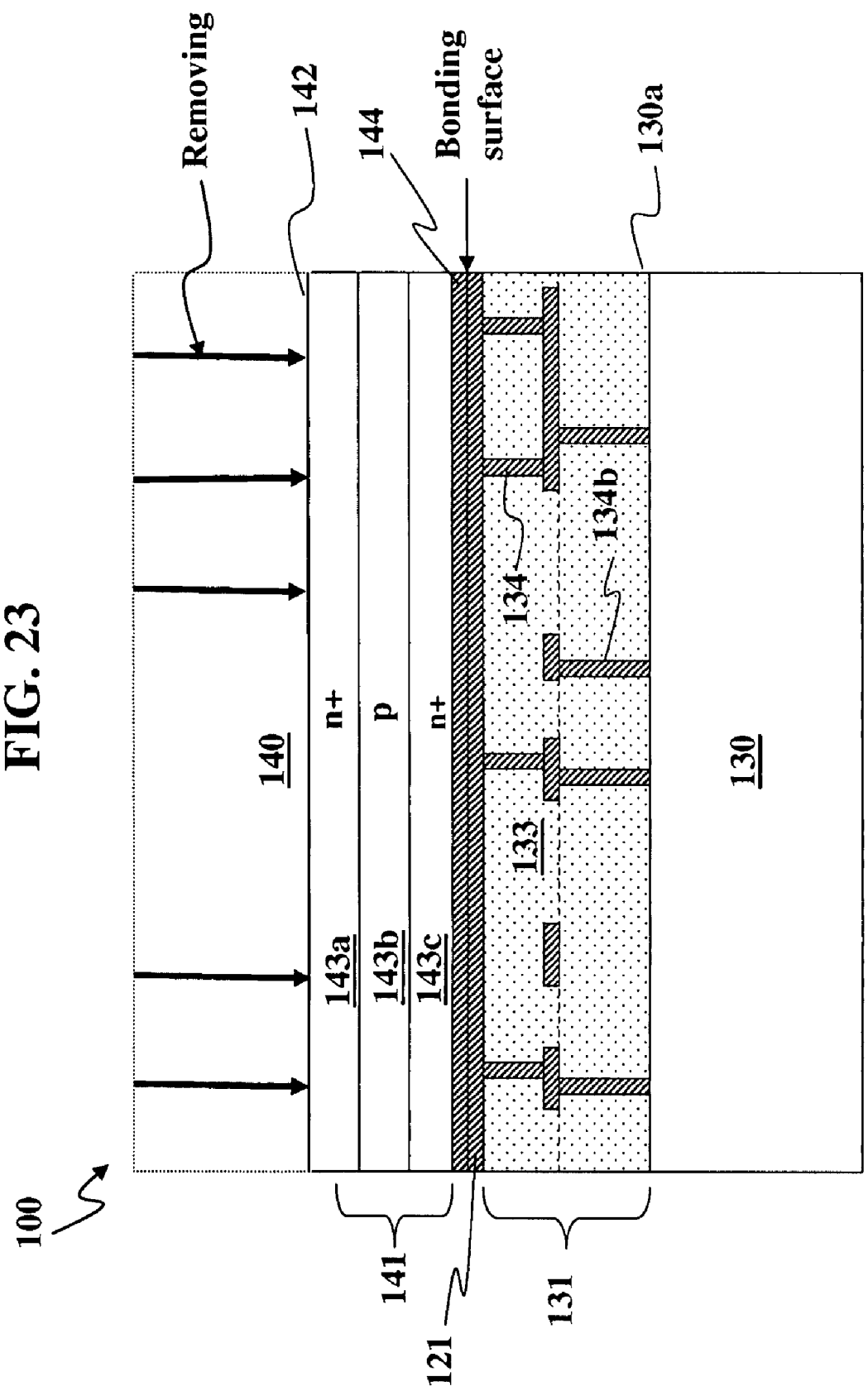

In FIG. 22, substrate 140 is removed using chemical force. The chemical force is provided by heating substrate 140 to a temperature at which the implanted hydrogen outgasses from detaching layer 142. The outgassing hydrogen causes stress within layer 142 so that substrate 140 and structure 141 are separated. In FIG. 23, substrate 140 or a portion thereof is removed by using conventional etching or chemical mechanical polishing (CMP), which is a process well known in the art.

FIGS. 24-27 are sectional views of steps in fabricating circuitry 101 using a semiconductor bonding transfer method. In this embodiment, circuitry 101 includes separate portions in which it is desired to bond them together in a manner similar to that discussed above. Here, however, circuitry 101 is formed using a handle substrate 110 to carry one of the portions and bond it to the other portion. One advantage of this method is that handle substrate 110 can be used to flip structure 141.

Another advantage of this method is that the donor wafer is bonded to the handle wafer and then processed as described above in conjunction with FIGS. 21-23. This is desirable because the acceptor wafer is not subject to high temperature and/or high pressure processing that the donor wafer is subject to when using mechanical or chemical force to cleave detach region 142. For example, the hydrogen is typically outgassed at a temperature that would damage the interconnect region 131 and/or electronic devices carried by acceptor substrate 130. Further, the electronic devices and/or interconnect region can be damaged by pressure from driving the wedge through region 142 or from the chemical mechanical polishing process.

This is desired because the acceptor wafer has electronic devices already formed thereon and high temperature and pressure processing can negatively impact the performance of these devices. Hence, the donor wafer is attached to the handle wafer and processed. After processing, the donor wafer is bonded to the acceptor wafer and the handle wafer is removed.

Figure 24:
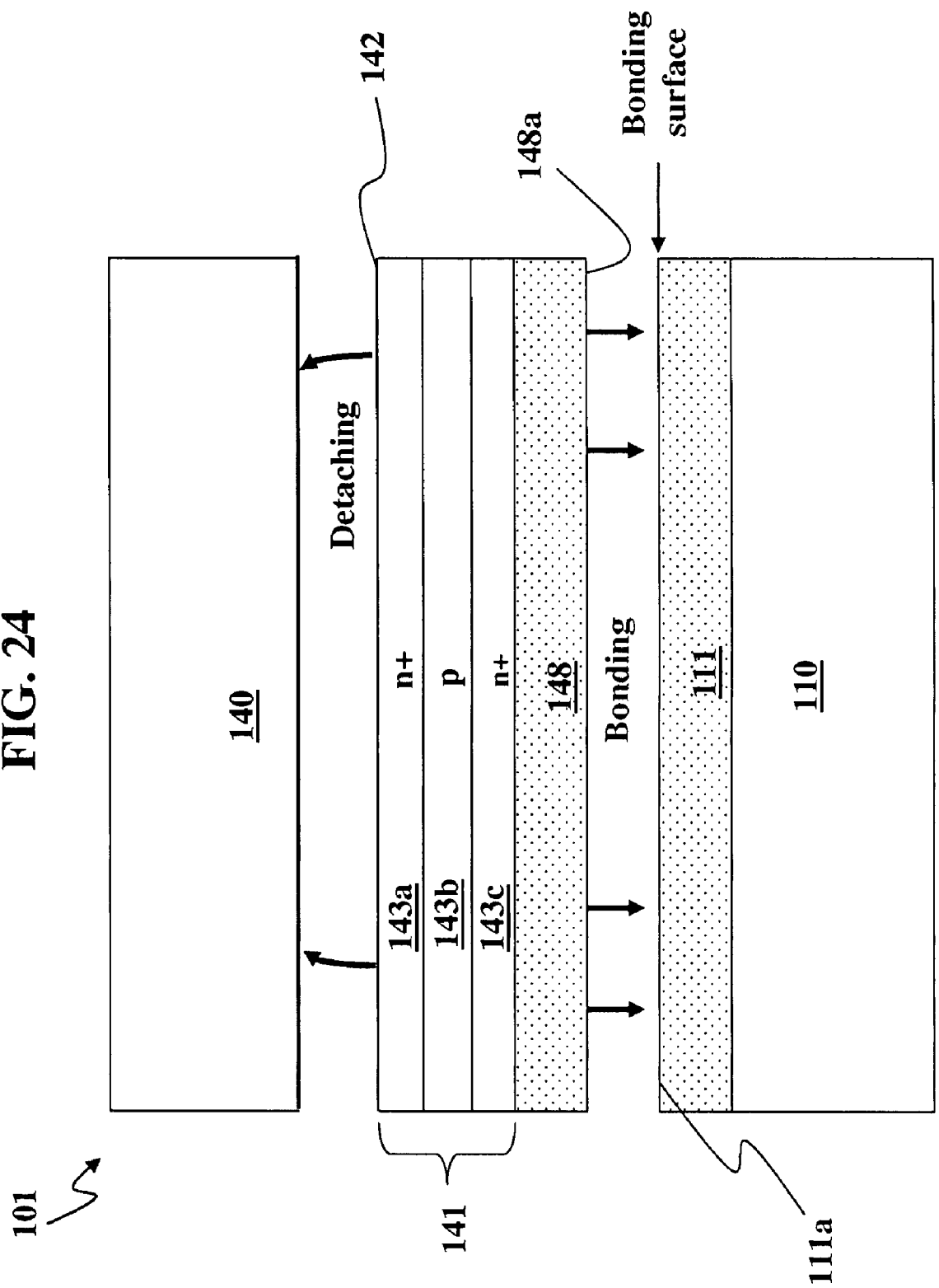
FIGS. 24-27 are sectional views of another method of fabricating an integrated circuit using the semiconductor bonding transfer method.

FIG. 24 is a sectional view of partially fabricated circuitry 101. Circuitry 101 includes donor substrate 140 which carries device structure 141 and dielectric region 148 positioned thereon. A handle substrate 110 with a dielectric region 111 positioned thereon is provided. In this embodiment, handle substrate 110 is flat and may include glass, plastic, ceramic, metal, and/or semiconductor material. Dielectric regions 111 and 148 are bonded together at surfaces 111a and 148a, respectively, and substrate 140 is removed from device structure 141. A plasma treatment can be used on surfaces 111a and/or 148a to increase the bond strength therebetween. In some embodiments, dielectric regions 111 and 148 can be bonded together with a glue layer, such as a polymeric adhesive, to provide easier and stronger bonding.

Figure 25:
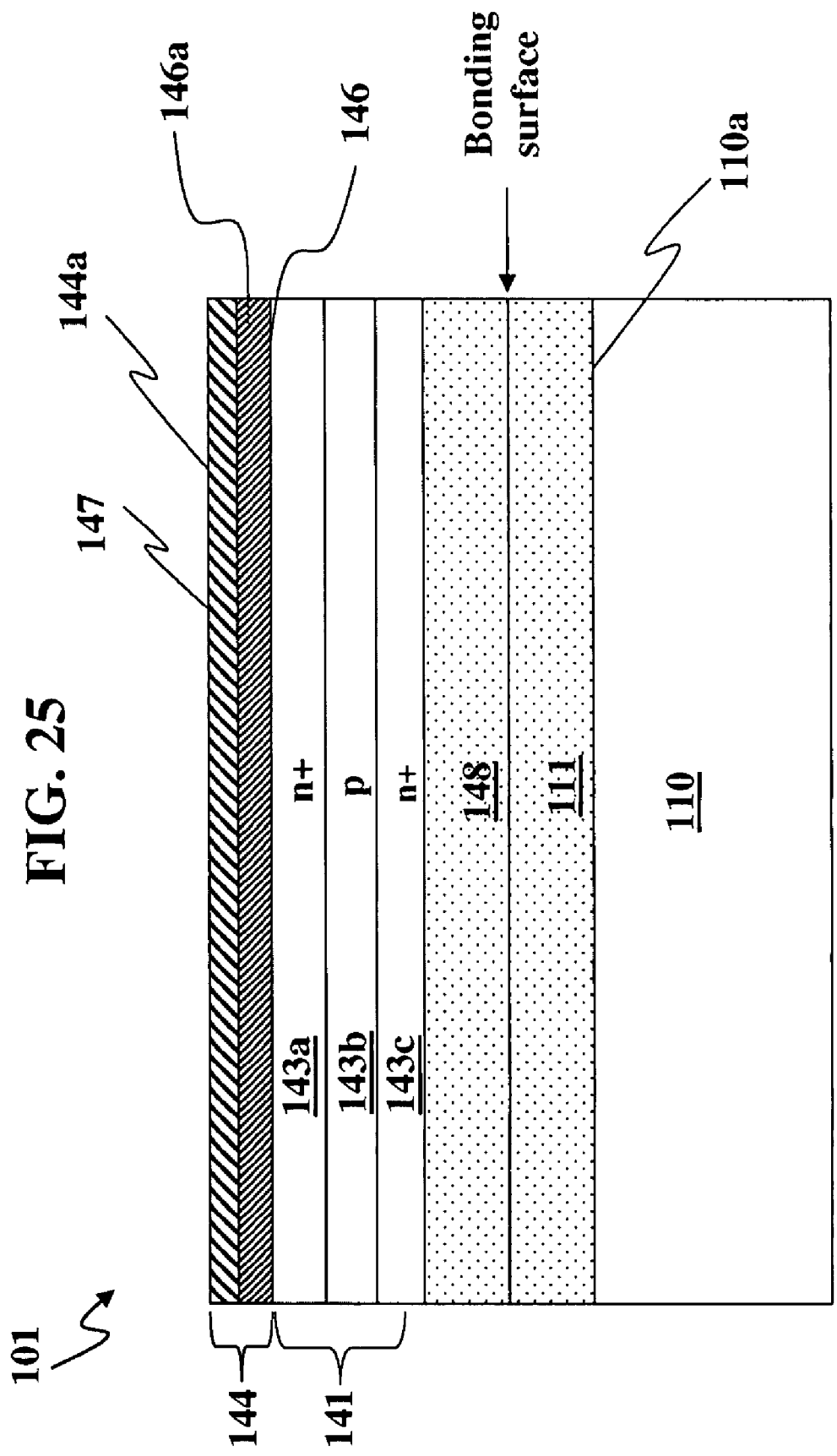
Figure 26:
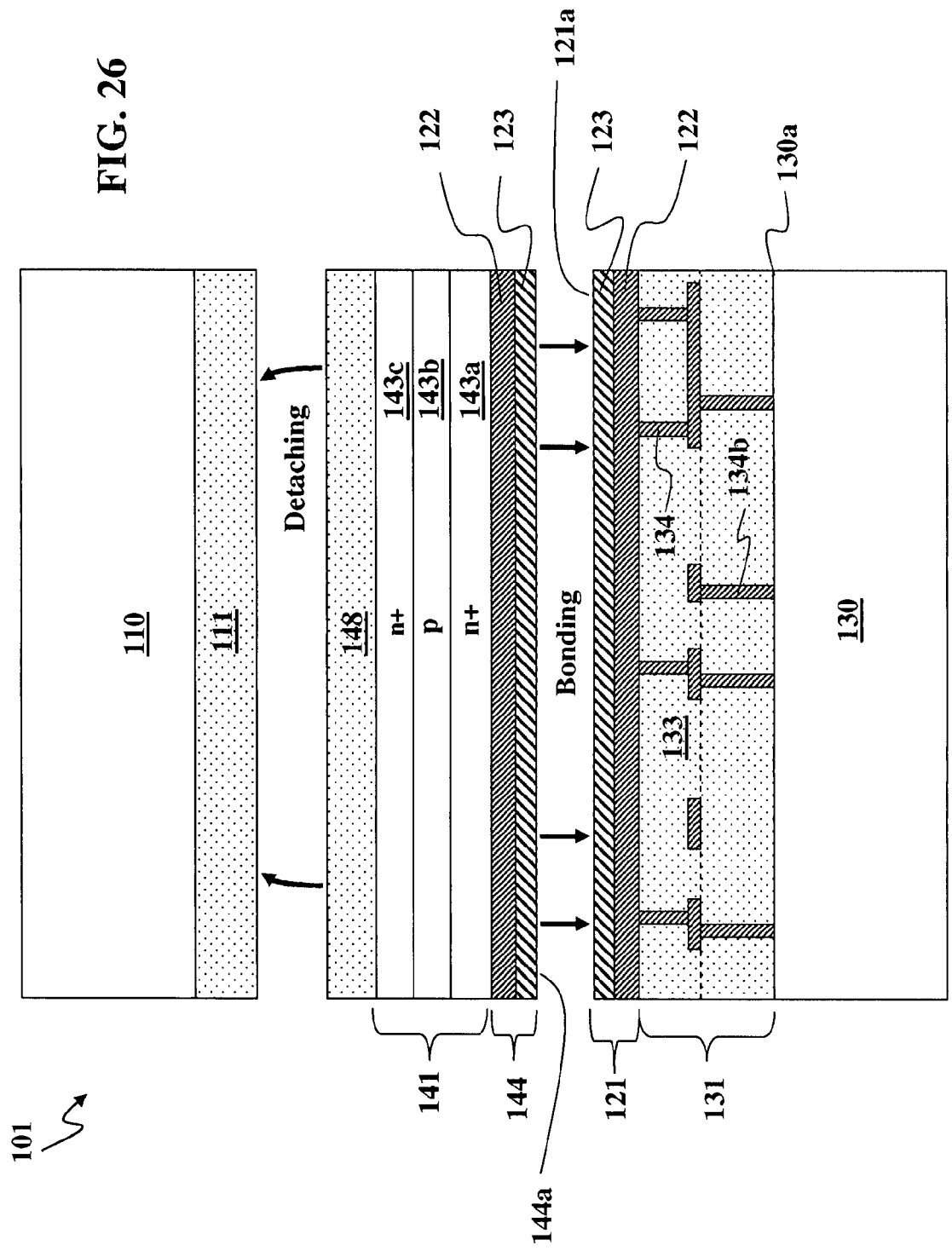

In FIG. 25, contact region 144 is positioned on device structure 141 opposite handle substrate 110. Here, contact region 144 includes conductive layer 146 positioned adjacent to device structure 141 and conductive glue layer 147 positioned on conductive layer 146. In FIG. 26, acceptor substrate 130 is provided. Substrate 130 carries interconnect region 131 thereon and contact region 121 is positioned on interconnect region 131. Contact region 121 includes conductive layer 122 and conductive glue layer 123. Surface 121a is coupled to surface 144a so that device structure 141 is coupled to the electronic devices carried by substrate 130 through interconnect region 131.

Figure 27:
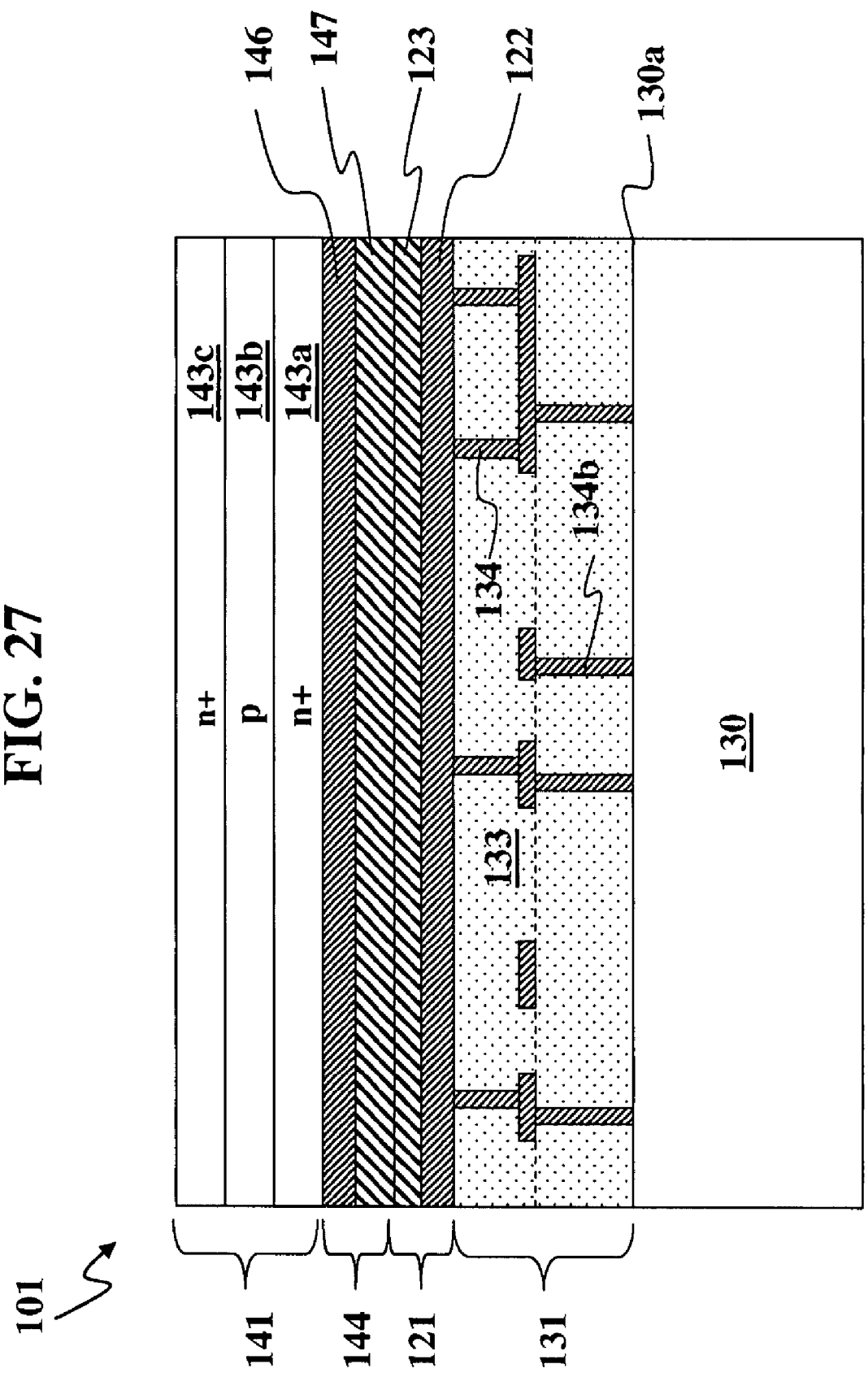

Dielectric regions 111 and 148 are separated from each other to separate dielectric region 111 and handle substrate 110 from device structure 141. In FIG. 27, dielectric region 148 is removed from device structure 141 so that device structure 141 can be further processed to form electronic devices as discussed above. In this way, the electronic devices formed from device structure 141 are electrically coupled to the electronic devices carried by acceptor substrate 130 through interconnect region 131 and bottom contact regions 121 and 144.

The embodiments of the invention described herein are exemplary and numerous modifications, variations and rearrangements can be readily envisioned to achieve substantially equivalent results, all of which are intended to be embraced within the spirit and scope of the invention.

The invention claimed is:

1. A method of forming a circuit comprising:
   providing a handle substrate;
   providing a donor substrate with a device structure positioned thereon, the device structure including a stack of semiconductor layers;
   coupling the handle and donor substrates together;
   removing the donor substrate from the device structure so that the device structure is carried by the handle substrate;
   providing an acceptor substrate which carries an interconnect region, the interconnect region being electrically coupled to electronic devices carried by the acceptor substrate;
   coupling the device structure and interconnect region together;
   removing the handle substrate from the device structure; and
   etching portions of the device structure to form a vertically oriented semiconductor device, the vertically oriented semiconductor device being in communication with the electronic devices carried by the acceptor substrate through the interconnect region.

2. The method of claim 1 further including providing a contact region so that, after the donor substrate is removed, the device structure and interconnect region are coupled together through the contact region.

3. The method of claim 1 wherein the step of providing the interconnect region includes providing a blocking region positioned to reduce the flow of contaminants therethrough.

4. The method of claim 1, wherein the electronic device(s) do not include horizontally oriented semiconductor devices.

5. The method of claim 1, wherein the electronic devices carried by the acceptor substrate are horizontally oriented devices.

6. The method of claim 1, wherein the device structure is etched to form the electrical device(s) after the device structure and interconnect region are coupled together.

7. A method of forming a circuit comprising:
   providing a handle substrate;
   providing a donor substrate with a device structure positioned thereon, the device structure including a stack of semiconductor layers;
   coupling the handle and donor substrates together;
   removing the donor substrate from the device structure so that the device structure is carried by the handle substrate;
   providing an acceptor substrate which carries an interconnect region, the interconnect region being electrically coupled to horizontally oriented electronic devices carried by the acceptor substrate;
   coupling the device structure and interconnect region together;
   removing the handle substrate from the device structure; and
   etching the device structure to form a vertically oriented electrical device, the electrical device being coupled to the horizontally oriented electronic devices carried by the acceptor substrate.

8. The method of claim 7 further including providing a contact region so that, after the donor substrate is removed, the device structure and interconnect region are coupled together through the contact region.

9. The method of claim 7, wherein the device structure is etched to form the vertically oriented semiconductor device after the device structure and interconnect region are coupled together.

10. The method of claim 7, wherein the device structure is not etched to form the vertically oriented semiconductor device before the device structure and interconnect region are coupled together.

11. The method of claim 7, wherein the device structure is not etched to form a horizontally oriented semiconductor device.

12. A method of forming a circuit comprising:
providing a handle substrate;
providing a donor substrate with a device structure positioned thereon, the device structure including a stack of semiconductor layers;
coupling the handle and donor substrates together;
removing the donor substrate from the device structure so that the device structure is carried by the handle substrate;
providing an acceptor substrate which carries an interconnect region positioned on horizontally oriented electronic devices;
coupling the device structure and interconnect region together;
removing the handle substrate from the device structure; and
processing the device structure to form a vertically oriented semiconductor device.

13. The method of claim 12 further including providing a contact region so that, after the donor substrate is removed, the device structure and interconnect region are coupled together through the contact region.

14. The method of claim 12, wherein the device structure is not etched to form a horizontally oriented semiconductor device.

15. The method of claim 12, wherein the vertically oriented semiconductor device is in communication with the horizontally oriented semiconductor devices through the interconnect region.

16. The method of claim 12, wherein the vertically oriented semiconductor device operates as a memory device.

17. The method of claim 12, wherein the device structure is processed to form the vertically oriented semiconductor device after the device structure and interconnect region are coupled together.

18. The method of claim 12, wherein the device structure is not processed to form the vertically oriented semiconductor device until after the device structure and interconnect region are coupled together.

\* \* \* \* \*